(12) United States Patent
Pedone et al.

(10) Patent No.: US 12,105,143 B2
(45) Date of Patent: Oct. 1, 2024

(54) SYSTEM FOR TESTING AN ELECTRONIC CIRCUIT COMPRISING A DIGITAL TO ANALOG CONVERTER AND CORRESPONDING METHOD AND COMPUTER PROGRAM PRODUCT

(71) Applicant: STMICROELECTRONICS S.r.l., Agrate Brianza (IT)

(72) Inventors: Leonardo Pedone, Civitanova Marche (IT); Simone Scaduto, Mussomeli (IT); Rossella Gaudiano, Milan (IT); Matteo Brivio, Cornate d'Adda (IT); Matteo Venturelli, Lonato del Garda (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 81 days.

(21) Appl. No.: 17/967,089

(22) Filed: Oct. 17, 2022

(65) Prior Publication Data
US 2023/0140765 A1  May 4, 2023

(30) Foreign Application Priority Data
Oct. 29, 2021  (IT) .................. 102021000027857

(51) Int. Cl.
*H03M 1/78* (2006.01)
*G01R 31/317* (2006.01)
*H03M 1/74* (2006.01)

(52) U.S. Cl.
CPC . *G01R 31/31724* (2013.01); *G01R 31/31706* (2013.01); *H03M 1/742* (2013.01); *H03M 1/785* (2013.01)

(58) Field of Classification Search
CPC ....... G01R 31/31724; G01R 31/31706; H03M 1/742; H03M 1/785; H03M 1/109; H03M 1/765; H03M 1/1071
See application file for complete search history.

(56) References Cited

U.S. PATENT DOCUMENTS

| | | |
|---|---|---|
| 6,445,325 B1 | 9/2002 | Burns |
| 9,985,641 B1 | 5/2018 | Ray et al. |
| 2010/0033358 A1 | 2/2010 | Sahu et al. |
| 2014/0153315 A1* | 6/2014 | Kwon ............... G11C 29/52 365/148 |
| 2018/0275424 A1* | 9/2018 | Lee ................... G02C 7/04 |
| 2021/0199719 A1* | 7/2021 | Shin ................ G01R 31/3004 |

* cited by examiner

*Primary Examiner* — Giovanni Astacio-Oquendo
*Assistant Examiner* — Zannatul Ferdous
(74) *Attorney, Agent, or Firm* — Seed IP Law Group LLP

(57) ABSTRACT

A digital-to-analog converter (DAC) includes a switching network and built-in-self-test (BIST) circuitry. The DAC, in operation, generates analog output signals in response to input codes of a set of input codes of the DAC. The BIST circuitry sequentially applies codes of a determined subset of codes of the set of input codes to test the plurality of switches. The determined subset of codes has fewer codes than the set of input codes. The BIST circuitry detects failures of switches of the plurality of switches based on responses of the DAC to the applied codes. In response to detecting a failure of a switch, the BIST generates a signal indicating a failure of the switching network.

35 Claims, 13 Drawing Sheets

SYSTEM FOR TESTING AN ELECTRONIC CIRCUIT COMPRISING A DIGITAL TO ANALOG CONVERTER AND CORRESPONDING METHOD AND COMPUTER PROGRAM PRODUCT

BACKGROUND

Technical Field

Embodiments of the present disclosure relate to techniques for testing electronic circuit, in particular integrated circuits, comprising digital to analog (DAC) circuits.

Description of the Related Art

The complexity of actual integrated circuit design and the consequent cost increase, due to test time related cost, forces to explore new methods of testing with the aim of simplifying test activity and improving efficiency.

The development of new technology nodes brought to the increase of design complexity (e.g., circuit with high level of configurability), more demanding quality requirements, with an increase of cost related to test time activities.

This cost could be reduced through an improvement of design architecture and testing methods.

Testing cost is one of the main contributes on the overall manufacturing cost of an integrated circuit. The increase of circuit configurability brings to a direct increase in the number of tests needed to cover all the possible configurations.

Circuits comprising a digital to analog converter (DAC) are affected by such problem: high configurability means a high number of bits and a huge number of input codes to be tested.

Usually, testing of a DAC input-output characteristic is based on selecting all the possible input codes and reading all the related output variables (e.g., currents or voltages) with external automatic testing equipment (ATE). As the number of bits, n, increases, then $2^n$ tests need to be performed with a great impact on test time cost.

Furthermore, tens of DACs may be present inside an integrated circuit, therefore the impact on test cost needs to be multiplied for the number of DACs.

More in detail, a digital to analog converter circuit is a circuit that converts a digital code into an analog current or voltage. The input of a digital converter is a code that ranges from 0 to $2^{n-1}$, where n is the number of bits, as mentioned. The output of the DAC is represented by a voltage (or current) that ranges from −VFS to +VFS (or from −IFS to +IFS), where VFS (or IFS) is the full-scale voltage value (dually IFS is the full-scale current value).

Every time the code at the input of the DAC changes, the output voltage consequently changes with a determined relation, which may be linear, exponential and so on.

Since random silicon defectivity, due to manufacturing process, may affect the DAC converter operation, it is important to check all combinations of input code-output variable. For instance, as the input code changes, the output could not change or the output could change with a relation different from the one expected (e.g., a relation different from linear): this may be because silicon defectivity has influenced the DAC input output characteristic.

Only silicon defectivity is considered responsible for problems on DAC characteristic under the hypothesis that DAC design determines a behavior aligned with design forecast/expectation (e.g., there is no systematic design error).

In order to detect and analyze issues possibly related with silicon defectivity, known solutions on DAC testing use an automatic test equipment (ATE) to check the relation between the input code of the DAC and the output variable, e.g., output analog voltage, of the DAC, for all the possible input combinations.

In FIG. 1 it is shown schematically a solution of a test architecture 10, where with 11 is indicated an electronic circuit, specifically an integrated circuit, which comprises a digital to analog converter 111, which is coupled to a voltage supply VDD for power supply and coupled to a reference voltage VREF. The electronic circuit 11 comprises a logic module or control circuitry 112, e.g., a dedicated control logic, which may for instance comprise a microprocessor or also be a network of logic gates, which sends an input digital code DC of n bits at the input of the DAC 111. The electronic circuit comprises an input/output interface 113 which includes an output terminal 113a at which an analog output voltage VDAC at the output of the DAC 111 is supplied. The input/output interface 113 also comprises an input terminal 113b. The electronic circuit 11 represents the circuit to be tested, whereas the test architecture 10 further includes an automatic test equipment, ATE, 12.

Such ATE 12 includes a voltmeter 121 which is coupled to an input voltage terminal 123a of a respective input/output interface 123 of the ATE 12 to which is coupled the output terminal 113a of the electronic circuit 11 and on which is available the analog output voltage VDAC. Also, the ATE 12 comprises a digital output terminal 123b, which supplies a test data TD, coupled to the input terminal 113b, which represents the input of the logic module 112. Therefore, a command module or circuitry 122 in the ATE 12, which may comprise a microprocessor, generates one or mode test data TD as input of the logic module 112 which generates corresponding digital codes DC with n bit for input in the DAC 11. The voltmeter 121 measures the corresponding analog voltage VDAC at the output.

A test performed by the ATE 12 thus may follow such a sequence:
- the ATE 12 communicates to the integrated circuit 11, through the digital interface 123 interface, and requests a change of the input digital code DC to the logic 112;
- the ATE 12 reads by means of the voltage meter 121 (or a current meter, if the output of the DAC is in current) the output variable on the dedicated pin VDAC;
- the ATE 12 repeats such operation $2^n$ times, one for each input code DC allowed by the DAC 11;

The duration of each communication of a new digital code DC by the ATE 12, $T_{COMM}$, requires typically few μs (e.g., maximum 10 μs), depending on the frequency of communication. Input code DC changes by the DAC 11 require a settling time, $T_{SETTL}$, typically of 1 μs. The duration of each ATE 12 reading, $T_{READ}$, at the voltmeter 121, requires typically 1 ms.

Considering a DAC with 10 bits, the total time of the test $DAC_{TOTAL\ TEST\ TIME}$ can be calculated with this formula:

$$DAC_{TOTAL\ TEST\ TIME} = 2^{n}*(T_{COMM} + T_{SETTL} + T_{READ}) = 1024*(1.011\ ms) = 1.035\ s$$

Therefore, the test of DAC input-output characteristic requires a huge number of tests in order to screen out random silicon defectivity on this architecture. Since test time cost has a relevant impact on IC manufacturing cost, this kind of test increases the cost as circuit complexity increases (e.g., DAC number of bits increases), which means that this test cost increases as technology evolves towards more and more complexity.

Once a defectivity has been detected, then it is also difficult to localize it inside the integrated circuit and a failure analysis needs to be performed with high cost (use of resources and time) for root cause identification.

In FIG. 2 it is shown an embodiment of the test architecture 10 shown in FIG. 1.

As shown, the DAC 111 of the electronic circuit 11 in the example is a 3 bit (n=3) resistive DAC which includes a ladder analog reference voltage Va, which is supplied in the example by a non-inverting op-amp amplifier 111a, which power supply is indicated with VDD and which receive at one input a reference voltage VREF. The other input receives a feedback voltage from the output through a feedback resistor R2 and it is coupled through a resistor R1 to ground GND so that Va=VREF*1+R2/R1. The output of the amplifier 111a supplying the ladder analog reference voltage Va is coupled to a multiplexer circuit 111b, which comprises a resistor ladder of $2^{n-1}$ resistors R in series, e.g., 7 resistors, between the amplifier 111a output, indicates as terminal or node $N_2{}^n$ and ground GND, indicated as node $N_1$, in the example 8 nodes with n=3, each i-th resistor R having its terminals $N_i$, $N_{i+1}$ coupled to the input of a voltage buffer 111c through $2^n$ respective selection switches $SW_2{}^n$ ... $SW_1$, controlled by respective codes DC, from binary 111 to binary 000 in the example. Therefore, each time a digital code DC, sent by the module 112 under the control of a respective test data TD, corresponding to a given i-th switch $SW_1$, i=$2^n$ ... 1, is received, such switch is closed, connecting the input of the buffer 111c to one of the series of resistors from the highest (code DC=111, switch $SW_2{}^n$, e.g., $SW_8$ closed) to the lowest, (code DC=000, switch $SW_1$ closed, coupling the input of the buffer 111c to ground). The other switches divide the output voltage by the corresponding ratio.

A possible test sequence according to the solution here described may include, that after the ATE 12 sends the test data TD corresponding to a digital input code DC digital word, of n bits, this is converted in and analog signal, e.g., voltage VDAC, by the DAC 111, which is available on the output of the buffer 111c, which is coupled to terminal 113a. As soon as the analog signal, voltage VDAC, is established, e.g., settled, the ATE reads 12, by means of the voltmeter 112, the analog signal, voltage VDAC. The ATE 12 compares the read analog signal, VDAC, with the expected one. If their difference is within an expected range (for example ±1/2 LSB), test results is good and a new test data DC/input code DC is sent to the IC DAC 111. Otherwise, if their difference is out of an expected range, test fails and test flow is stopped.

This architecture requires $2^3$ number of tests with a total test time $DAC_{TOTAL\ TEST\ TIME}$ of:

$$DAC_{TOTAL\ TEST\ TIME}=2^{3*}(T_{COMM}+T_{SETTL}+T_{READ})= 8*(1.011\ ms)=8.088\ ms$$

This is a simple kind of DAC, therefore testing time can be significantly higher as the number of bit increases.

FIG. 3 shows a diagram representing the typical DAC step function with a presence of a fault condition PF. In abscissa is the input code DC, while the ordinate is the DAC output voltage VDAC read at the ATE 12.

For a given digital input code DC, the analog signal read by the ATE is not the expected one, thus a fault condition PF occurs for that input code DC value.

In this case, it is difficult to address the cause of the problem, thus means which component is failing into IC.

BRIEF SUMMARY

In an embodiment, a device comprises a digital-to-analog converter (DAC) and built-in-self-test (BIST) circuitry. The DAC has a switching network, and, in operation, the DAC generates analog output signals in response to input codes of a set of input codes of the DAC. The BIST circuitry is coupled to the DAC, and, in a self-test mode of operation, sequentially applies codes of a determined subset of codes of the set of input codes to test the plurality of switches. The determined subset of codes has fewer codes than the set of input codes. The BIST circuitry detects failures of switches of the plurality of switches based on responses of the DAC to the applied codes. In response to detecting a failure of a switch, the BIST circuitry generates a signal indicating a failure of the switching network.

In an embodiment, a system comprises an automatic testing device (ATE), an interface; and a digital-to-analog converter (DAC) coupled to the ATE via the interface. The DAC, in operation, generates analog output signals in response to input codes of a set of input codes of the DAC. The DAC includes a switching network having a plurality of switches, and built-in-self-test (BIST) circuitry coupled to the switching network. The BIST circuitry, in a self-test mode of operation of the DAC, sequentially applies codes of a determined subset of codes of the set of input codes to test the plurality of switches. The determined subset of codes has fewer codes than the set of input codes. The BIST circuitry detects failures of switches of the plurality of switches based on responses of the DAC to the applied codes. In response to detecting a failure of a switch, the BIST circuitry generates a signal indicating a failure of the switching network.

In an embodiment, a method comprises sequentially applying to a digital-to-analog converter (DAC), using built-in-self-test (BIST) circuitry of the DAC, codes of a determined subset of codes of a set of inputs codes of the DAC. The determined subset of codes has fewer codes than the set of input codes of the DAC. Failures of switches of a plurality of switches of a switching network of the DAC are detected by the BIST circuitry based on responses of the DAC to the applied codes of the determined subset of codes. In response to detecting a failure of a switch of the plurality of switches, an indication of a failure of the switching network of the DAC is generated by the BIST circuitry.

In an embodiment, a non-transitory computer-readable medium's contents cause built-in-self-test (BIST) circuitry of a digital-to-analog converter (DAC) to perform a method. The method comprises sequentially applying to a digital-to-analog converter (DAC), using built-in-self-test (BIST) circuitry of the DAC, codes of a determined subset of codes of a set of inputs codes of the DAC. The determined subset of codes has fewer codes than the set of input codes of the DAC. Failures of switches of a plurality of switches of a switching network of the DAC are detected by the BIST circuitry based on responses of the DAC to the applied codes of the determined subset of codes. In response to detecting a failure of a switch of the plurality of switches, an indication of a failure of the switching network of the DAC is generated by the BIST circuitry.

BRIEF DESCRIPTION OF THE SEVERAL VIEWS OF THE DRAWINGS

Embodiments of the present disclosure will now be described with reference to the annexed drawings, which are provided purely by way of non-limiting example and in which.

DETAILED DESCRIPTION

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

The solution here described, to detect the presence of silicon defectivity, which leads to unexpected behavior on DAC input-output characteristic, provides dividing such detection on the essential blocks of a digital to analog converter. In fact, a generic digital to analog converter may be seen as composed by:
 circuit components (e.g., resistors, current sources, capacitors, etc. . . . ), which, in particular arranged in networks and circuital arrangements, provide the analog voltage scaling according to their configuration;
 a multiplexing network, which configure such arrangement of circuit components according to the input digital code to be converted.

The proposed solution provides testing separately the circuit elements and the multiplexing network, so that, as a consequence, the absence of silicon defectivity on overall DAC architecture is verified.

Thus, the solution here described provides a method for testing a DAC converter which comprises a first test of the circuit components and a second test of the multiplexing network, different from the first test.

The first test on circuit elements, or network of electronic components, includes performing an analog readout of the analog output (voltage or Current) of the DAC.

Circuit elements, as mentioned, could be resistors, capacitors, currents, and so on depending on DAC architecture.

The second test of the multiplexing network, which in general is common to all DAC architectures and it includes an arrangement of switches (e.g., CMOS transistors), includes a built-in self-test.

Figure 1:
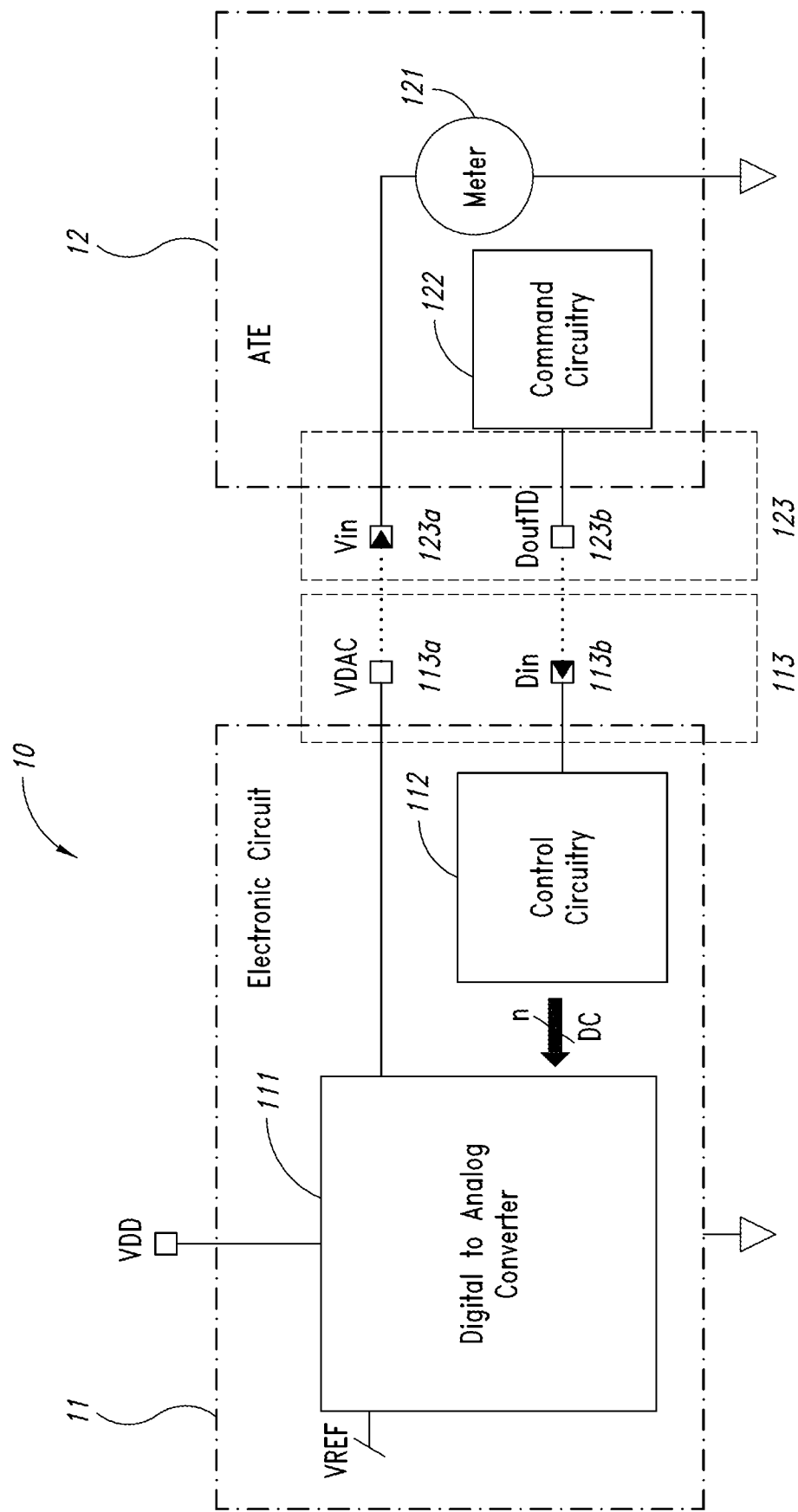
FIGS. 1 to 3 have already been described in the foregoing.
Figure 4:
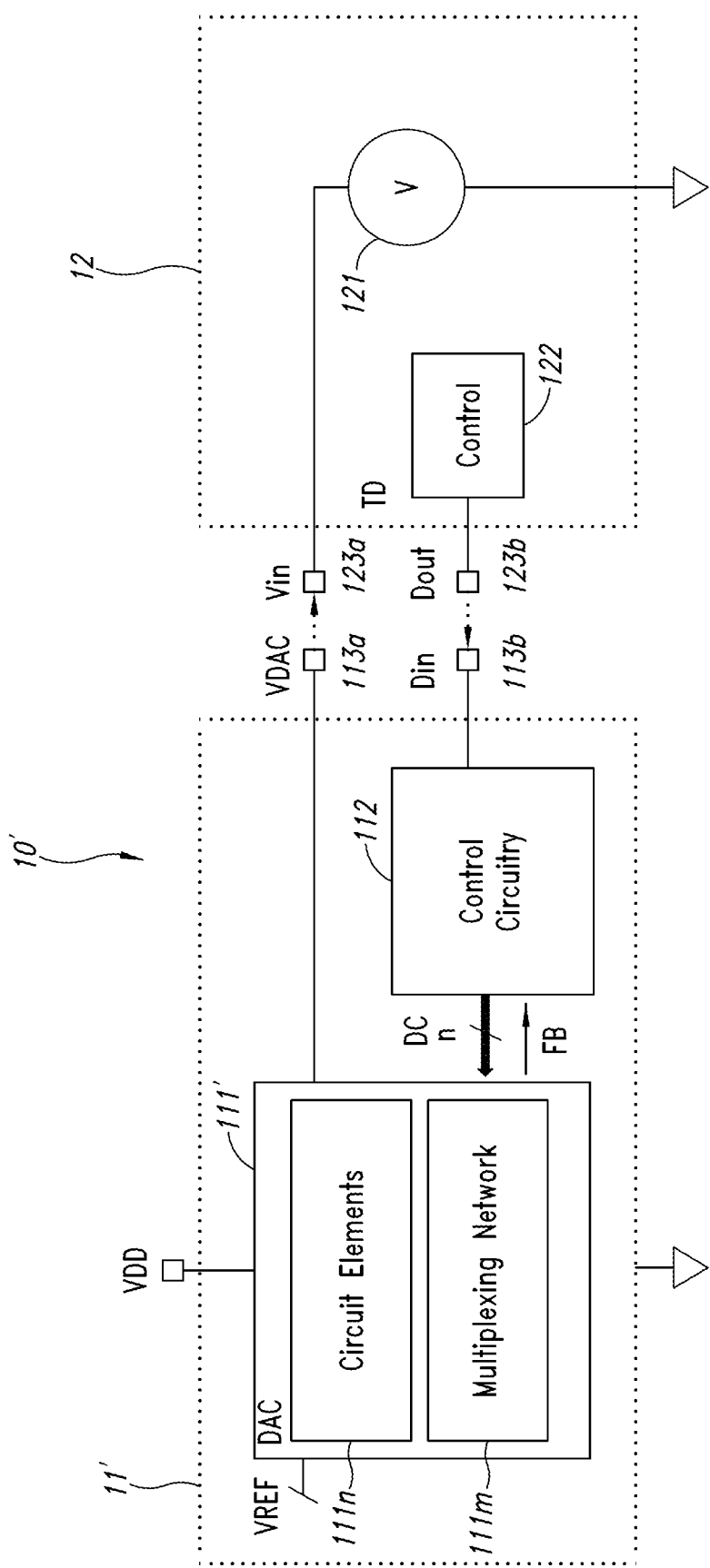
FIG. 4 is a schematic block representation of a test system according to an embodiment.

In FIG. 4 it is shown a schematic block representation of an embodiment of the proposed solution which corresponds substantially to the block representation of FIG. 1, however in the system for testing 10' is comprised an electronic circuit 11' in which the DAC 111 is shown as comprising a block 111n corresponding to the circuit elements and a block 111m corresponding to the multiplexing or switching network. The arrangement of the architecture is then similar to that of FIG. 1, providing test data TD from the ATE 12, and reading the analog output, in particular analog voltage VDAC, by the voltmeter 121 of the ATE 12. However, a feedback signal FB is issued additionally by the multiplexing network 111m to the IC logic module 112, which is configured to carry out the first test under the control of the ATE 12 (test data TD) and the second test as a built-in self-test (BIST), which is therefore fully integrated into the IC logic 112 (the ATE 12 does not need to supply test data as input, and does not need to receive outputs of the DAC during the second test). The control logic 112 may comprise logic gates, a processor and a memory, a state machine, etc., and various combinations thereof Similarly, the control logic 122 may comprise logic gates, a processor and a memory, a state machine, etc., and various combinations thereof.

This test strategy is intended in particular for production purpose, where test-time is critical for IC manufacturing cost, with respect to IC development, where duration of the test program may not impact the manufacturing cost. Instead, when the development is ended and production starts, the need of test with short duration is necessary.

The method for testing here described may comprise thus two phases:
 a first test phase of the set of circuit elements or components where the logic 122 of the ATE 12 assigns to the DAC 111 one digital data TD to be converted in analog signal. The measuring instrument, e.g., voltmeter 122, reads the corresponding analog converted signal VDAC and the value measured is compared with an acceptable range to determine pass/fail criteria. If the result is "pass," then there are not defects on the basic components;
 a second test phase of the multiplexing network 111m, which is managed by the electronic circuit, in particular integrated circuit, 10', specifically by the logic module or control circuitry 112, which makes it a built-in self-test. In general, such second test phase may include that the logic module 112 is configured to provide, autonomously, an input code DC to the multiplexing network 111m corresponding to a certain configuration of the switches in the multiplexing network 111b, and then waits, as a feedback signal FB, the output of the multiplexing network 111m, as a digital state (a state which can be logical 0 or logical 1). On the basis of the feedback signal FB state, the logic module 112 is configured to determine if a fault is occurring inside the multiplexing network 111m. At the end of the built-in test, the logic 112 writes test result inside a register. If all the output states FB for all the different input codes DC, e.g., switching network configurations, in the sequence of the built-in self-test provided by the logic 112 are the expected one, the logic 112 considers the test as "pass." Otherwise, in case at least one of the states FB stored in the register does not match the expected one, the logic 112 considers the test as "fail." Further, the register status can be checked, on the basis of the register address storing the not matching result, to understand which path of the multiplexer 115m failed.

This solution allows to measure all relevant test parameters inside the integrated circuit 11' and then compare them with an expected value, for example, also inside the integrated circuit 11'. The final result of the comparison (Pass/Fail) is sent to the automatic test equipment 12' through a fast communication interface (not shown in FIG. 4).

Figure 2:
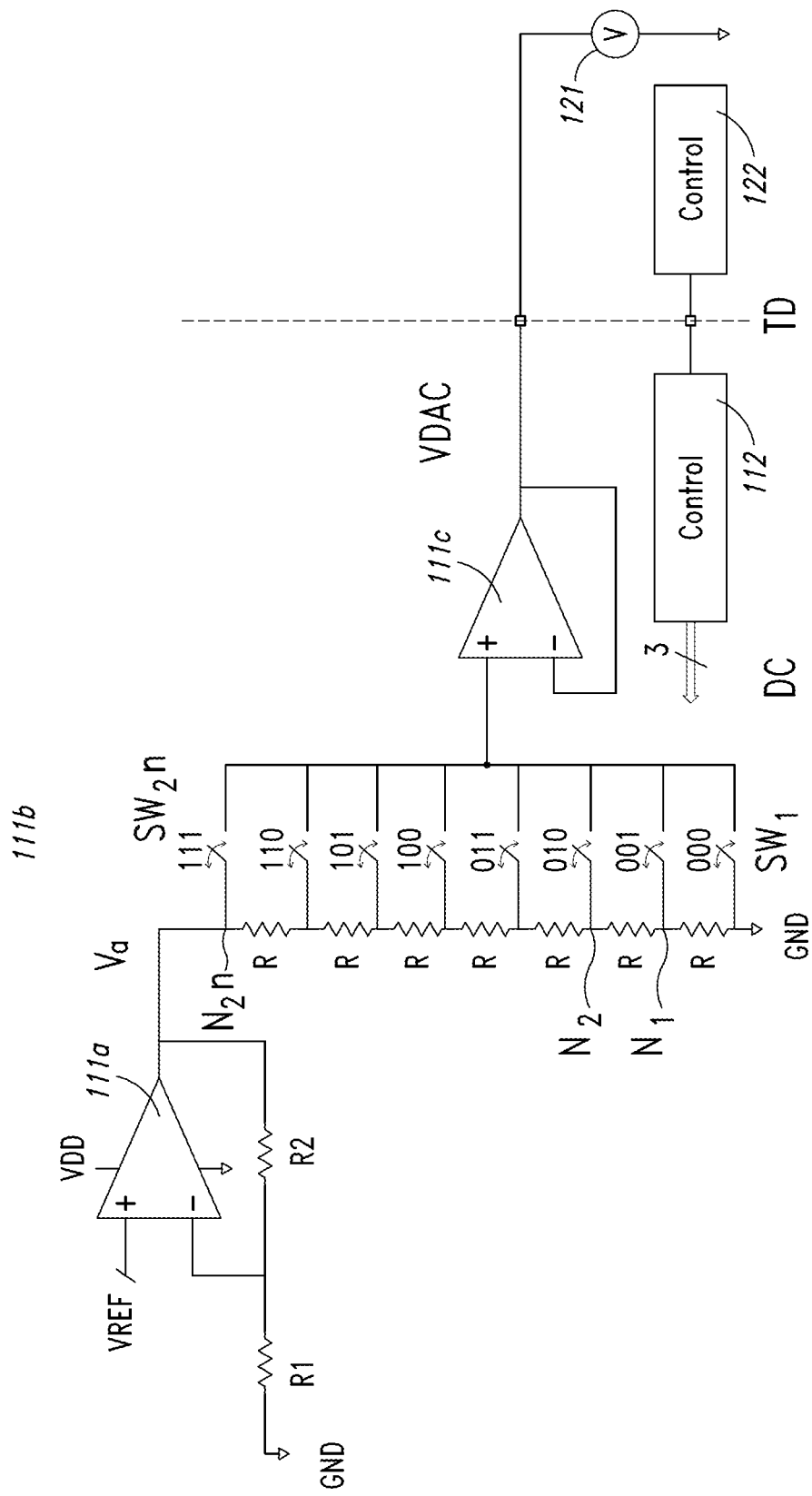
Figure 3:
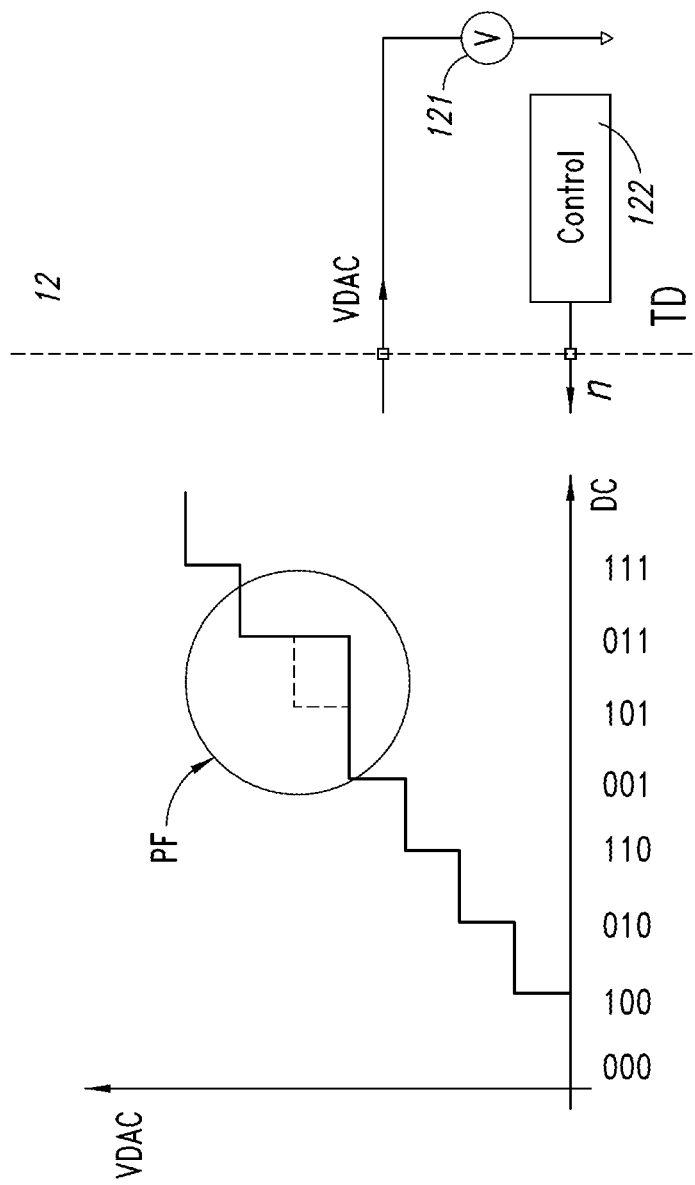
Figure 5:
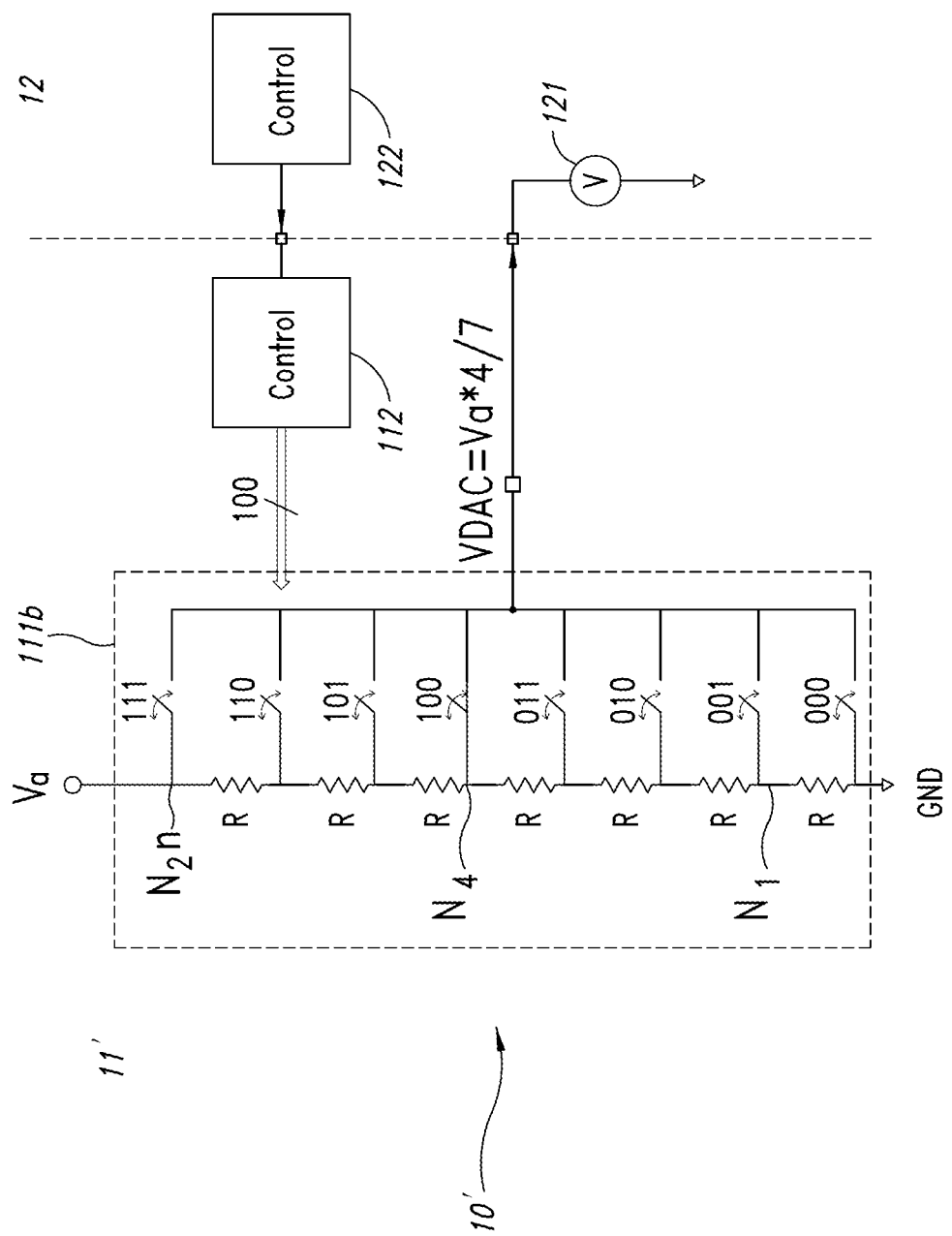
FIG. 5 is a schematic circuit representation of a test system with an electronic circuit comprising a resistive converter in a first test phase according to an embodiment.

FIG. 5 shows an implementation of the solution described which is analogous to the one of FIG. 2, with a 3-bit resistive DAC architecture, with reference to the first test of the circuit elements. The representation of FIG. 5 substantially corresponds to FIG. 2, as the first test uses the same hardware, however the amplifier 111a is not shown, only a ladder reference analog voltage Va at the input of the resistor ladder which is coupled between the ladder reference analog voltage Va and ground GND.

Thus, the first test may comprise:
the logic 122 sets one digital test data TD to be converted in analog signal (in the example shown in FIG. 5 the logic value 100);
after the internal logic 112 receives the data TD and provides the corresponding digital code DC the DAC 111 provides the corresponding analog signal VDAC (in the example, switch SW4 corresponding to DC code 100 is closed, the other switches are open, VDAC=Va*4/7;
the output analog signal VDAC is measured with the external voltmeter 121 provided by ATE 12;
reading of external voltmeter 121 is compared with a defined range, which may be predefined. In case the reading is inside the range the test on basic components passed successfully. Instead, if the reading is out of the range test is considered failed.

The number of analog readings performed by ATE 12, in order to perform the first test on circuit elements may depends on the DAC architecture used. For example, in the example shown in FIG. 5 implementation, three variables are present into the architecture: ladder reference analog voltage Va, ground voltage GND and resistor ladder ratio. For this reason, three reads may be performed to test the arrangement of circuit elements, in this case the resistors R.

Regarding the first test phase specifically in the circuit of FIG. 5, the multiplexing network 111b is used to select a single signal, e.g., a voltage divided by a certain ladder ratio from multiple available inputs, e.g., terminals $N_2{''} \ldots N_1$. For instance, at a generic i-th node $N_i$, a voltage $Va*i/(2^n-1)$ is formed. Thus, the multiplexing network 111b usually comprises a plurality of inputs, e.g., terminals $N_2{''} \ldots N_1$, a bit selector with n bit, which controls the open and close state of a set of switches $SW_2{''} \ldots SW_1$, respectively associated to terminals $N_2{''} \ldots N_1$, each of which switch is associated in order to command for example its closing, by a corresponding n-bit, in the example n=3, digital code DC, to convey the analog quantity, e.g., voltage, of the corresponding branch to the single output of the multiplexing network 111b.

For what regards the second test phase of the multiplexing network of switches, the main components under test are the switches $SW_2{''} \ldots SW_1$ driven by the n bit selector, which on the basis of the n bit binary value decoded from the digital code DC selects open and close states of the corresponding switch among switches $SW_2{''} \ldots SW_1$.

Networks like multiplexing network 111b are typically used into DAC architecture, since they allow, in normal operation, for each digital code DC which drives the n bit selector a different input voltage among those at terminals $N_2{''} \ldots N_1$ to be brought to the output.

The most common defects that affects the switches such as $SW_2{''} \ldots Sw_1$ are Open failure, a switch is never closed, and Close failure, a switch is always closed.

These defects could degrade the DAC characteristic with deviation from expected behavior.

Thus, the second test phase may comprise in general the following steps:
a determined DAC 111 code DC corresponding to a required test configuration of the switches, additionally including test signals (e.g., signals enabling operation of circuit elements dedicated to the test such as current generators, as enable signal En in the following) is forced;
the logic module 112 waits for the DAC 111 settling time in order to have a stable output;
a feedback signal FB from DAC 111 is evaluated and compared with the expected result at the logic module 112. The feedback FB may be taken directly from the output of the DAC or through a feedback network which derives the feedback signal FB from the DAC output signal;
if the feedback signal FB is correct, e.g., matches the expected result for the specific determined code DC at input, the logic 112, if there is another code DC to be executed in the test, thus there is another configuration to test, changes the DAC input code DC, and starts the next check. If there is an error, e.g., the feedback signal FB does not match the expected result, in embodiments the corresponding digital code DC and the fault may be reported, for instance to the ATE 12 through a communication interface, while in variant embodiments, in particular if a plurality of digital codes DC is sent, the corresponding feedback signal values may be stored and then an evaluation of the result of the multiplexing network test is performed on the values stored, e.g., in a register of the logic 112. Then, after reporting the result regarding a single DAC input code DC or storing it, also in this case the logic 112 may start the next check or stop the test. If there is only one digital code DC and one configuration (e.g., all switches OFF like in FIG. 6A described in the following) the result, correct or in error, may be reported or stored as well;
the second test phase of the multiplexing network 111b ends after all the combinations of n bits for the digital codes DC required by the test, e.g., BIST test, are checked or when an error is detected.

The use of self-test, internally to the integrated circuit 11, leads to reduce transition delay between one code DC and the other, thus reducing testing time of multiplexing network.

Figure 6B:
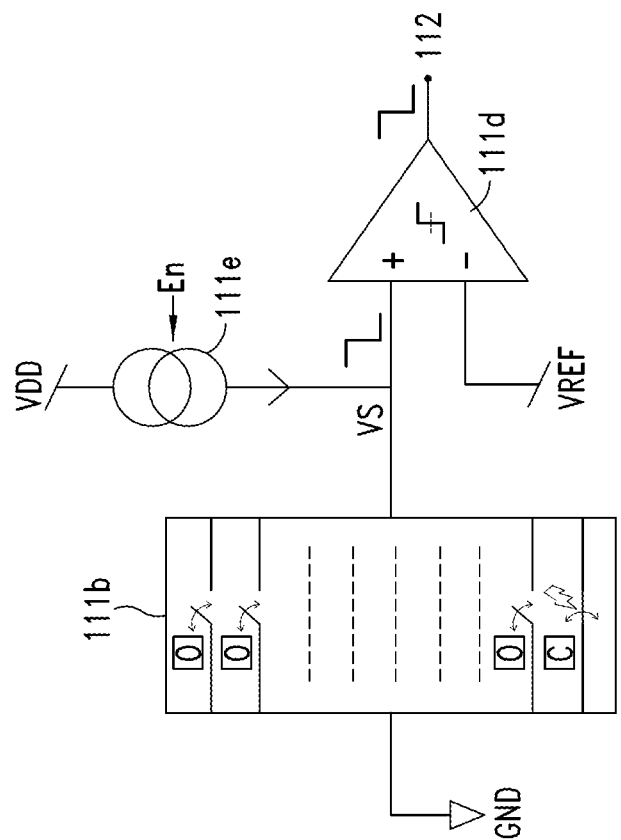
FIG. 6A represents a first test phase in a no-fault close switch scenario and 6B represents a first test phase in a fault close switch scenario according to an embodiment.
Figure 6A:
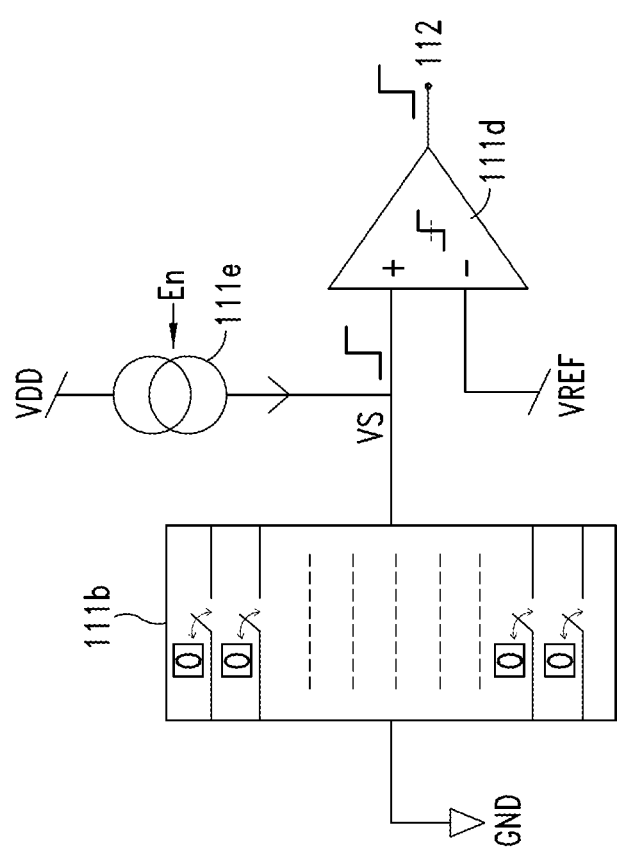

In FIG. 6A it is shown schematically the Close failure test in case of no fault, e.g., good result. The goal of this test is the detection of defects on switches $SW_{2^n}$ ... $SW_1$ and dedicated logic, e.g., bit selector, of the multiplexing network.

Thus, in FIG. 6A the multiplexing network is represent by the switches $SW_{2^n}$ ... $SW_1$, which are for simplicity shown coupled at one terminal of the multiplexing network to ground GND, although they are in fact coupled through ground through the corresponding divider of resistors R, in the case of the resistive DAC (or corresponding current generator operating as pull down like the ladder resistor network as shown in the variant embodiment of DAC Current Steering shown in the following). The other terminal is coupled to the input of a threshold comparator 111d, which other input is coupled to a threshold voltage VREFT. A pullup current generator 111e is coupled between the input of the threshold comparator 111d coupled to the multiplexing network and the voltage supply VDD, injecting a current in the node VS of the threshold comparator 111d. The output of the threshold comparator 111d is coupled to the logic 112, which runs a state machine 112b based on the output logic value of the threshold comparator 111d.

The FIG. 6A shows the close failure test in case of good result.

Here, switches are forced OFF and all of them are in high impedance state.

An implementation of the execution of the test of the multiplexing network of switches for close failure may comprise the following steps:
  a pull up current of the pull up current generator 111e is enabled by an enable signal En supplied by the logic 112;
  all the switches $SW_{2^n}$ ... $SW_1$ are forced in OFF state by the logic module 112;
  in case all the switches $SW_{2^n}$ ... $SW_1$ are OFF, an open circuit is present between the node VS and ground;
  the pull up current of the generator 111e pulls up the node VS to the supply voltage VDD value and the output of the comparator 111d goes high, considering that VREFT=VDD/2;
  test result is good, since an OFF state is being forced on all the switches and all the switches $SW_{2^n}$ ... $SW_1$ result in high impedance condition.

All the switches $SW_{2^n}$ ... $SW_1$ are placed in parallel and only one test it is necessary to verify if all the switches $SW_{2^n}$ ... $SW_1$ are able to be in open state and, as a consequence, good manufactured.

This test can be quite fast in execution (in the order of microseconds) because it is performed inside the integrated circuit 11'. No interaction with ATE 12 external instrumentation is needed.

The FIG. 6B shows the same Close failure test in case of fault, e.g., when all the switches $SW_{2^n}$ ... $SW_1$ are forced in OFF state and not all them result in high impedance state.

An implementation of the test of the multiplexing network of switch for close failure may comprise the following steps:
  the pull up current of the generator 111e is enabled by an enable signal En supplied by the logic 112
  all the switches $SW_{2^n}$ ... $SW_1$ are forced in OFF state by the logic 112;
  because of defects in the multiplexer network 111b, one or more switches are in ON condition ($SW_1$ in the example shown), even if they are forced in OFF condition. Therefore, a low impedance, e.g., a low impedance path, is present between the node VS and ground GND;
  as a consequence, the Pull Up current generator 111e is not able to pull up the node VS to a voltage greater than the reference voltage VREFT and the output of the comparator 111d remains low;
  test result is not good, since an OFF state is forced on the switches, however at least a low impedance path is still present, as indicated by the output of the comparator 111d remaining low.

Figure 7B:
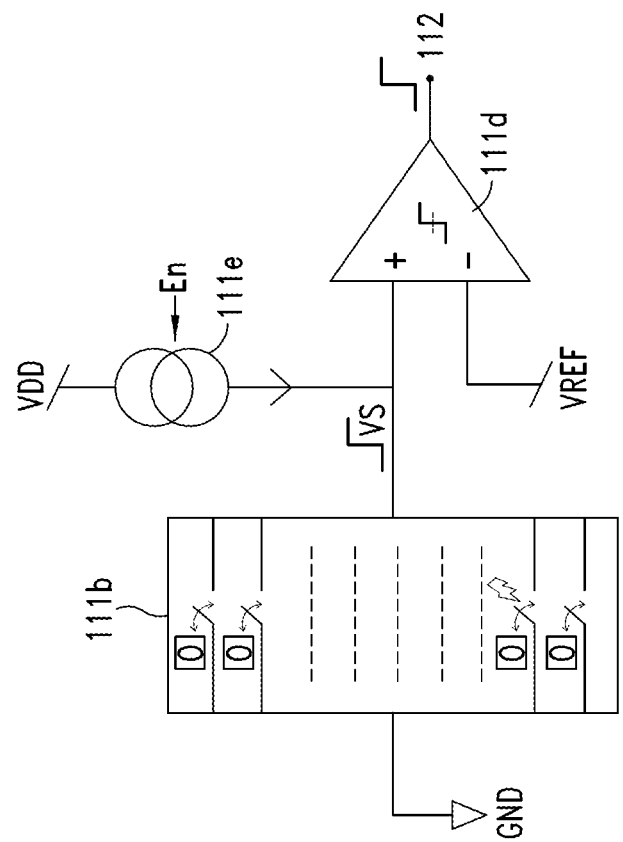
FIG. 7A represents a second test phase in a no-fault close switch scenario and 7B represents a second test phase in a fault open switch scenario according to an embodiment.
Figure 7A:
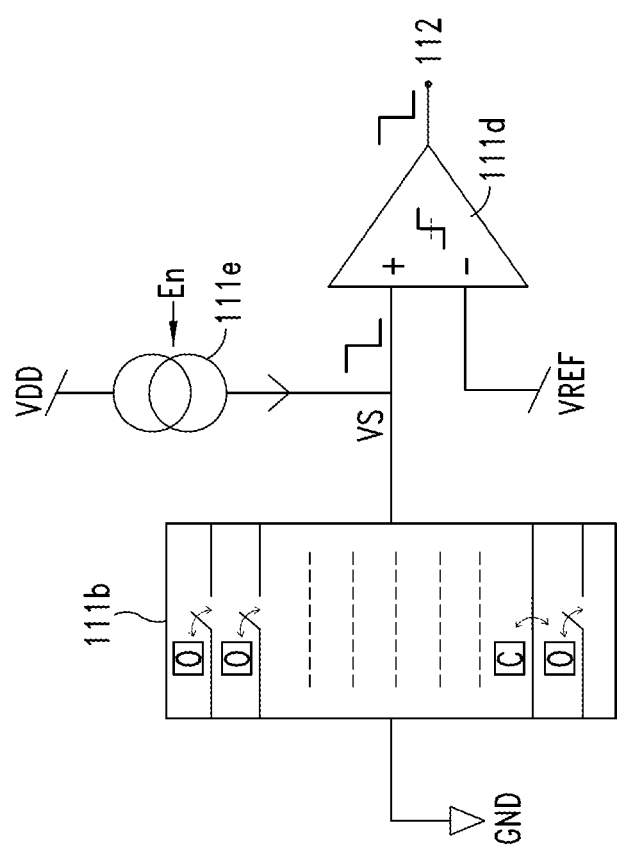

FIG. 7A shows schematically an open failure test of multiplexing network in case of No fault.

Here, switches are forced in ON state, one by one, and all the combination should be low impedance state to give a pass or no fault result.

An implementation of the execution of the multiplexing network of switch may comprise the following steps:
  Pull Up Current of the generator 111e is enabled by an enable signal En supplied by the logic 112;
  all the switches $SW_{2^n}$ ... $SW_1$ are forced by the logic 112 iteratively in ON state, one by one. N iterations are employed, with N number of switches; In this embodiment $N=2^n$ because the DAC multiplexer is composed by one stage of parallel switches, but in case of more stages the number of switches could be lower than $2^n$.
  for each iteration, one switch is ON and all the others are OFF. Therefore, if all the switches follow the command of the logic 112 in this test, a low impedance path has to be present between the node VS and Ground;
  the Pull Up current generator 111e is consequently not able to pull up the node VS to the supply voltage VDD value and the output of the comparator 111d remains logic low;
  test result is evaluated as good, e.g., pass, since with ON state forced on each single switch the output of the comparator 111d remaining at logic low indicates that a low impedance path is present.

This open failure test employs N iterations, with N number of switches. It can be executed in a short time (in the order of microseconds for each iteration), because it is performed inside the integrated circuit 11, and no interaction with external equipment is needed.

The FIG. 7B shows the Open failure test of multiplexing network in case of Fault.

The figure shows the Open failure test in case of NOT good result, e.g., fail or fault. Here, switches are forced ON, one by one, and it is detected that not all the combination of switches so obtained outputs a low impedance state at node VS.

An implementation of the execution of the test of the multiplexing network of switch for Open failure may comprise the following steps:
  Pull Up Current of the generator 111e is enabled by an enable signal En supplied by the logic 112
  all the switches $SW_{2^n}$ ... $SW_1$ are forced by the logic 112 iteratively in ON state, one by one. N iterations are employed, with N number of switches;
  for each iteration one switch is commanded closed and all the other ones are commanded open by the logic 112. If one switch is damaged (in the example shown $SW_2$), a high impedance path between the node VS and ground is present;
  in this case, the Pull Up current generator 111e pulls up the node VS to the power supply VDD value and the output of the comparator 111d goes high (voltage at VS>VREFT).

Test result is NOT good, e.g., a pass for the test, since ON state is forced to each single switch but a high impedance path is found to be present checking the output of the comparator 111*d* at high logic value.

Figure 8:
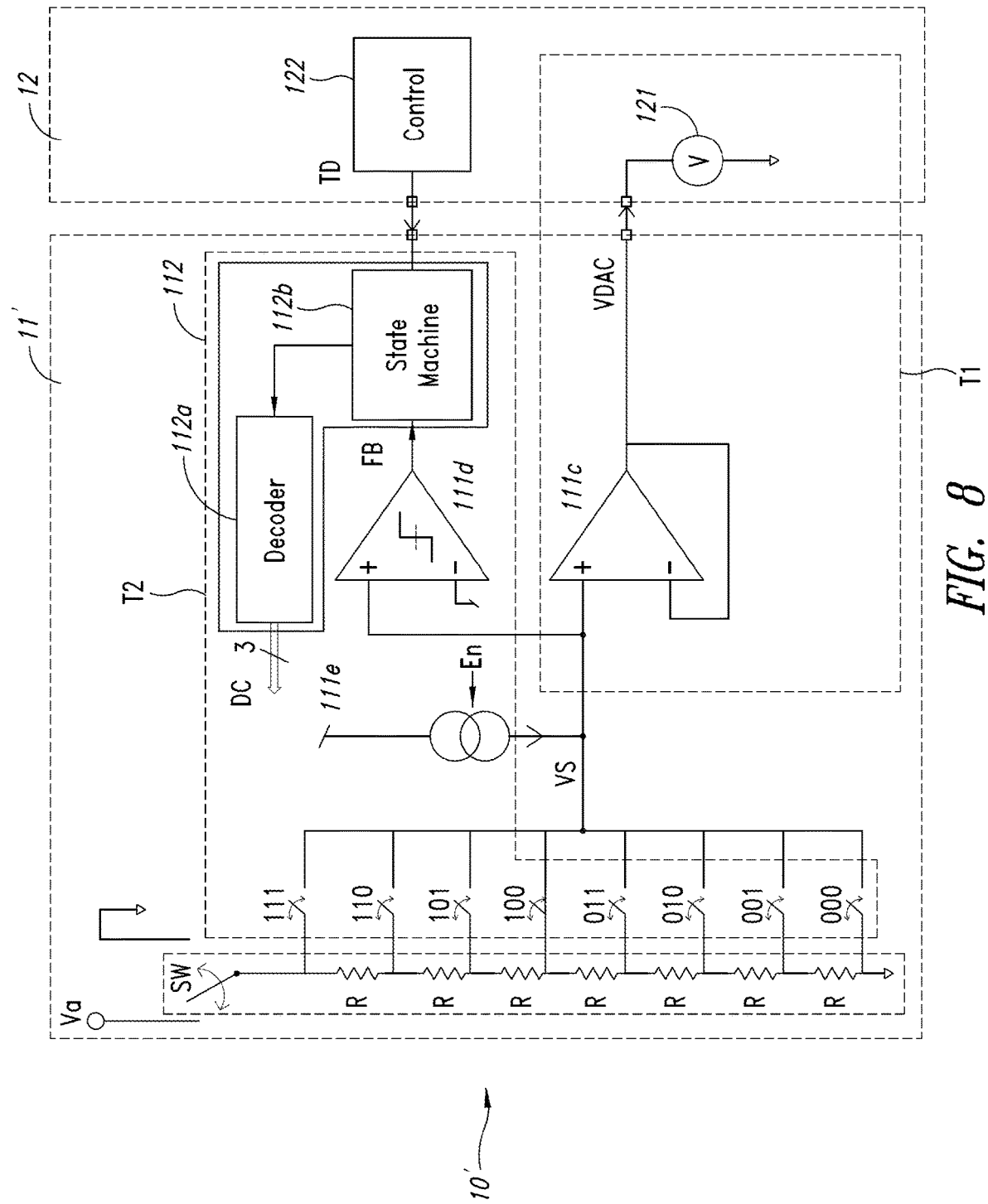
FIG. 8 is a schematic circuit representation of a test system with an electronic circuit comprising a resistive converter in a second test phase according to an embodiment.

In FIG. 8 it is shown an embodiment of a complete test architecture for a resistive DAC, where are indicated the circuit elements employed in the first test phase of the electronic components (block T1) and the circuit elements employed in the second test phase of the multiplexing network of switches (block T2).

A switch SW is provided which switches the input of the divider between analog voltage Va for the first test phase, block T1, and the ground GND for the second test phase, block T2.

The buffer 111*c* input and the comparator 111*d* input, shown in FIGS. 5 and 6A-7B are both coupled to the multiplexing network output, e.g., to node VS.

Thus, the test of a resistive DAC like the one in FIG. 8 comprises:

a first test phase of the electronic components in which the ATE 12 sends one digital data to be converted. The DAC 11, in which the resistive divider high terminal is coupled to the analog voltage Va, in particular by a switch SW selectively coupling between analog voltage Va and ground GND the high terminal of the divider. The divider converts it in an analog signal and a voltmeter 121 reads the analog VDAC, as also shown with reference to FIG. 5. ATE 12 compares this result with a defined range (which may be predefined) to determine pass/fail criteria. This test covers the internal structures of the voltage divider and buffer 111*c*;

a second test phase of the multiplexing network of switches in which the pull up current generator 111*e* is enabled (signal En) and the resistive divider high terminal is coupled to ground GND; then, a close failure test (as described in FIGS. 6A and 6B) is performed. Logic 112 keeps all switches in OFF state. If the output of the comparator 111*d* goes high, result test is good, e.g., test passed; subsequently open failure test starts. Then the open failure test is performed (as described in FIGS. 7A and 7B). All switches are forced in ON state condition, one by one, while all the others are maintained OFF. If the output of the comparator 111*d* is low, test result is good, otherwise there is a fault. At the end of the test, logic 112 writes the results into a register, for instance a resister in the logic 112.

The logic 112 is shown as comprising a logic state machine 112*b* which operates the second test phase on the basis of the comparator 111*d* output, commanding a digital front end and decoder 112*a* which generates the digital code DC requested by the state machine 112*b*. In the first test phase, the logic 112 sets the digital test data TD, one by one, to be converted in analog signal, using the decoder 112*a*, as shown with reference to FIG. 5, to test the analog voltage VDAC.

Figure 9:
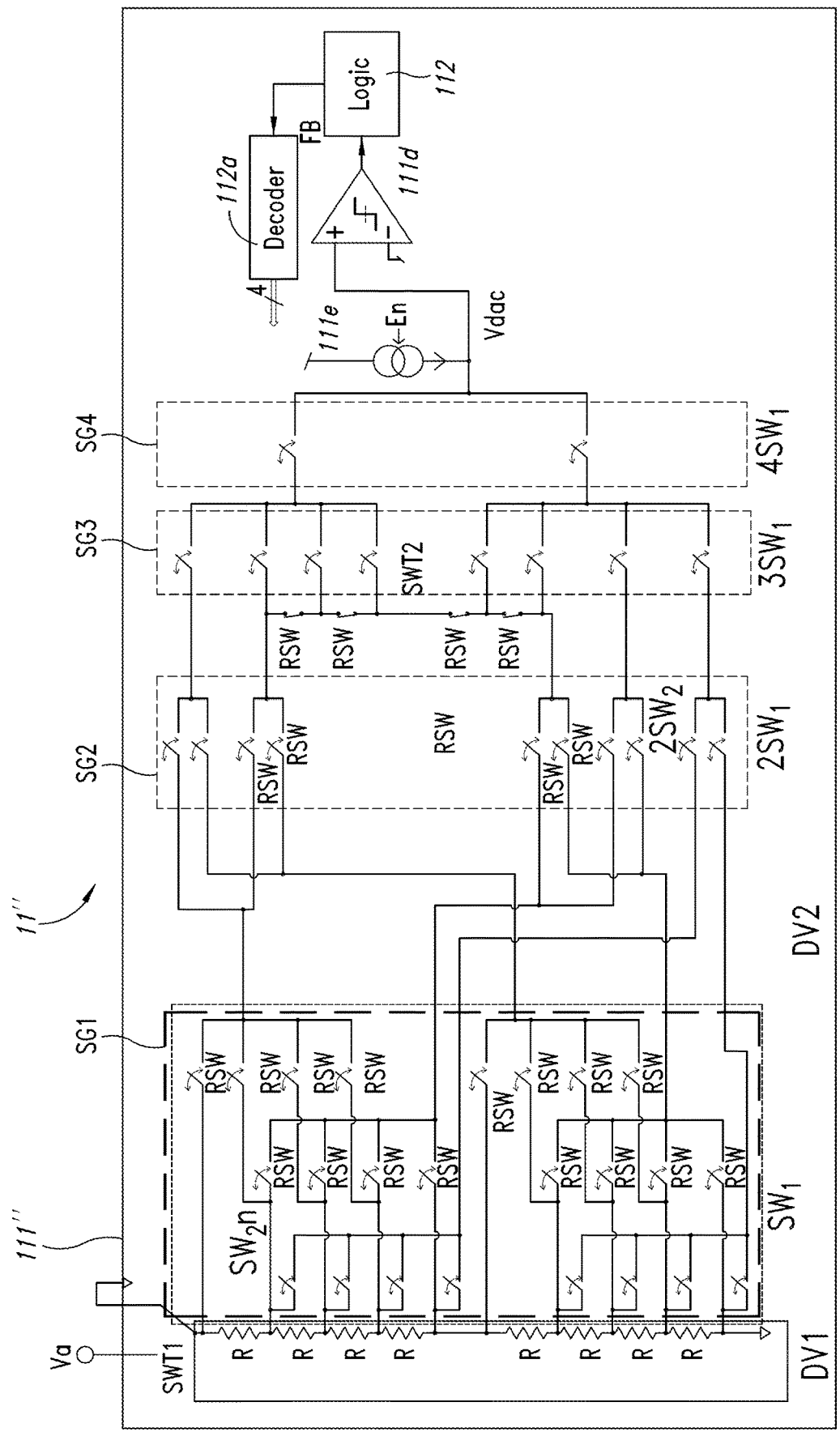
FIGS. 9-10 are schematic circuit representations of a test system with an electronic circuit comprising a multistage resistive converter in a second test phase and first test phase respectively, according to an embodiment.

In FIG. 9 it is represented an embodiment using as DAC 111", a 6 bit distributed DAC: this structure composed of two voltage dividers connected by set of switches:

a first voltage divider DV1, which is analogous to the divider 111*b* of FIG. 5, and comprises thus the resistors R in series, the nodes of the series made accessible by the related switches SW1 . . . SW2*n*-1, which are controlled by the most significant bits (MSB). Switches SW1 . . . SW2*n*-1 have negligible resistance value with respect to the other value of the resistors in the architecture (R and Rsw, as shown here below);

a second voltage divider, DV2, which is made of a network of resistive switches SWR, with resistance RSW, having, starting from the output node of the DAC, a tree structure comprising a plurality of stages, each including a plurality of branches with resistive switches SWR and also switches with negligible resistance, starting from first stage SG1, which branches are coupled to the nodes of the first divider DV1, to arrive, through stages with less branches/bifurcation, to a first stage SG1 coupled to the output node of the DAC, which has two branches with two switches with negligible resistance to select the upper portion or a lower portion of the network. The stages SG1, SG2, SG3, SG4 in series, some always closed and some other configurable by the input code DC. The related switches are controlled by the less significative bits (LSB).

the state of all the switches are controlled by a decoder, e.g., decoder 112*a*, which translates input code to control signals.

Configuration switches SWT1 and SWT2 have been added to implement multiplexer self-test; SWT1 corresponding to the switch SW in FIG. 5 selectively coupling Va and GND, while switch SWT2 selectively couples the upper portion of the network of DAC 111', downstream the fourth stage SG1, with the lower portion.

Figure 10:
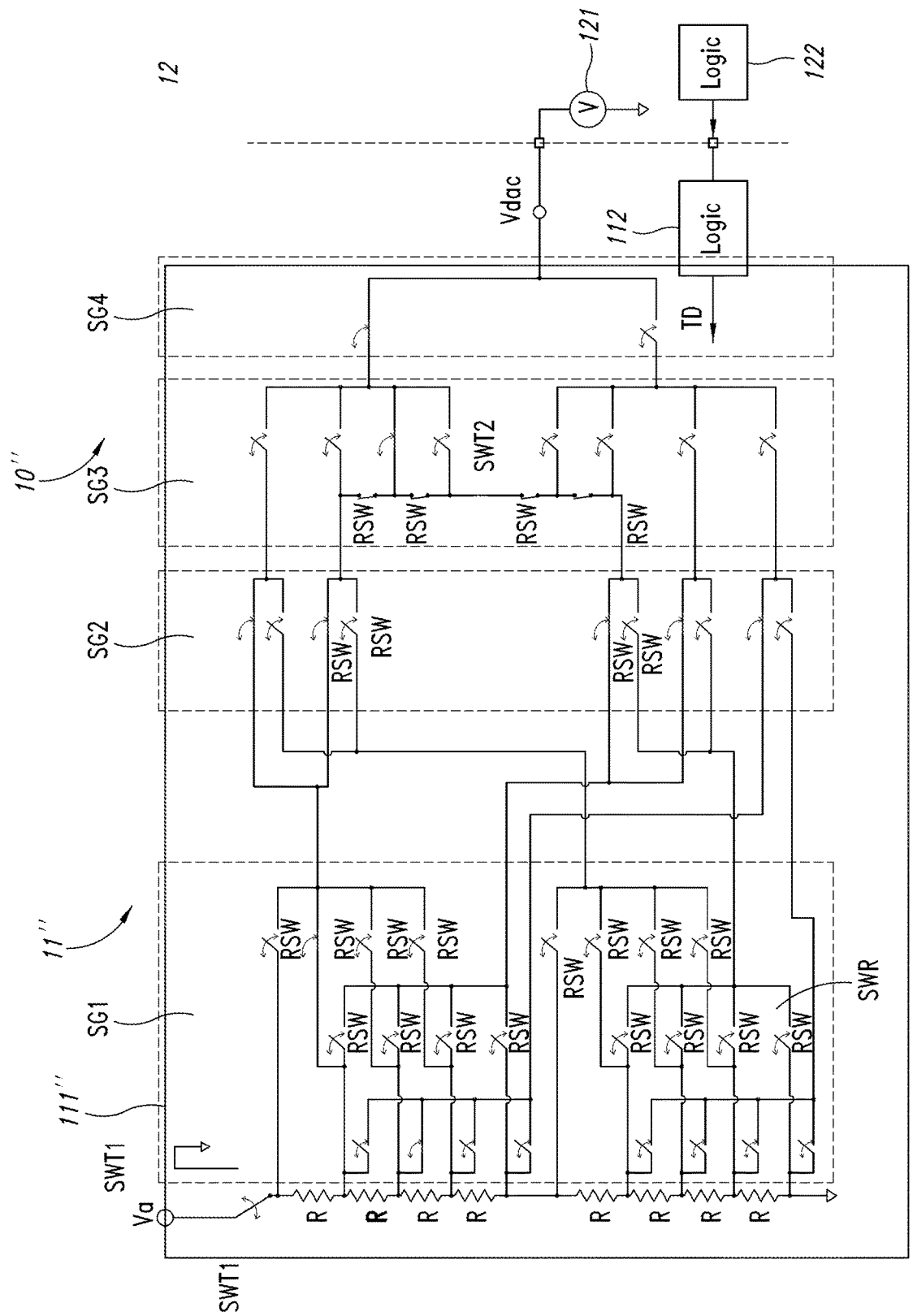

FIG. 10 shows how the first test is performed by means of external equipment (ATE) 12.

Test execution in the first test phase:

switch SWT2 is closed, SWT1 connected to analog reference voltage Va;

the ATE 12 sends one digital data TD to be converted (110101 in this example);

The decoder 112*a* of the DAC 111" commands the switches to turn ON/OFF according to the value of the digital data TD to be converted, bringing to the output, VDAC, the corresponding voltage;

ATE 12 reads the analog signal VDAC with a voltmeter 121 and compares it with a defined range (which may be predefined), in order to evaluate if it is within or outside such range;

with three measurements (lower limit code 000000 and upper limit code 111111 plus an intermediate code between such limits) all physical structures of first and second divider DV1, DV2 are covered.

In FIG. 9 is shown the second test phase, e.g., test multiplexing network (BIST) (second test phase), for the DAC 111', a 6 bit distributed DAC, with the two subtests of the second test phase: close failure test and open failure test.

The close failure test includes:

switch SWT1 coupled to ground GND, switch SWT2 closed coupling the upper and lower branch;

Pull Up current 111*e* and comparator 111*d* are enabled.

each stage SG1 . . . SG4 is sequentially tested by turning OFF the switches of the stage under test and turning ON all other switches. For example, switches of the fourth stage SG4 are kept OFF while all the others are close. If switches are not damaged, output of the comparator goes high and so test result is good;

secondly, third stage SG3 switches are kept OFF, all the others are kept ON. If the switches are not damaged, output of the comparator 111*d* goes high and so test result is good;

the test is repeated in the same way for the second SG2 and first stage SG1.

The open failure test includes:

Switch SWT1 coupled to ground GND, SW2 is open, separating the upper and lower branches. Pull Up current and comparator enabled. Each switch is tested by closing each path between the output analog voltage VDAC and the first resistor divider DV1. If all the programmed switches are correctly closed the output analog voltage VDAC will be forced to ground GND by the divider and comparator output will be low. This means no fault present.

For example, in order to test the fourth stage SG4, the first, the second and the third stages switches are kept ON, while the fourth stage switches are closed one by one. If the output of the comparator 111d remains low, test results is good.

By way of example the open failure test on third stage SG3: SWT2 is open, stage SG1, stage SG2 and stage SG4 all closed. Stage SG3 switches are closed one at a time. If the output of the comparator 111d remains low, test results is good.

A similar test may be performed for stage SG1 and stage SG2.

A further embodiment may be directed to a current steering DAC architecture.

Figure 11:
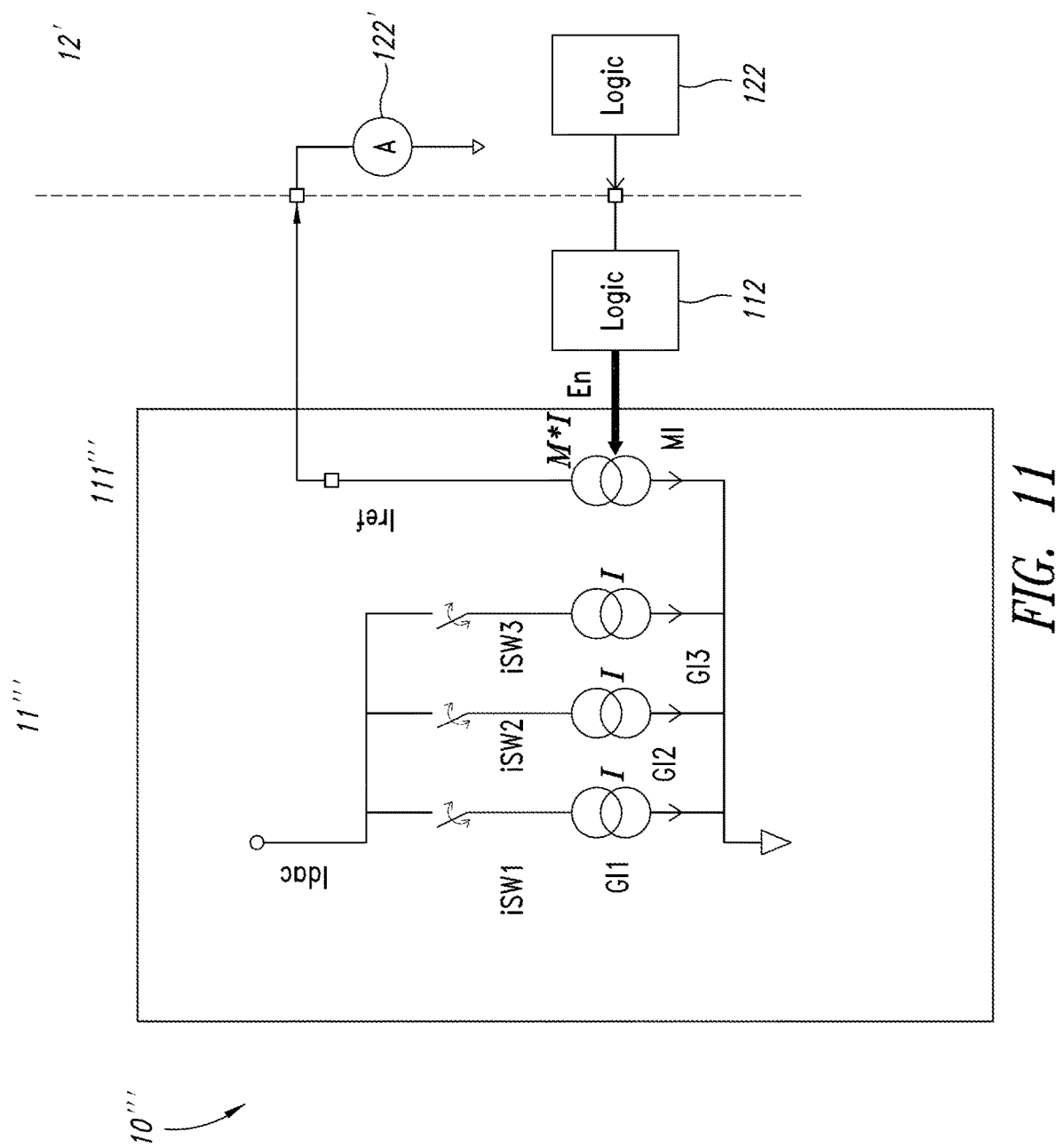
FIG. 11 is a schematic circuit representation of a test system with an electronic circuit comprising current steering converter in a first test phase according to an embodiment.

FIG. 11 shows a possible implementation to test basic components, e.g., perform the first test phase, into a 2-bit Current steering DAC architecture 111'''.

The current steering unary (i.e., all the generator deliver a same current I) architecture shown comprises three current generators GI1, GI2, GI3, i.e., $2^{n-1}$, n being the number of bits, supplying a determined current I, which are selectively coupled to the analog current output Idac by a respective switch iSW1, iSW2, iSW3. The three current generators GI1, GI2, GI3 are obtained as parallel current mirrors, e.g., as transistor, in particular MOSFET transistor, which are coupled by their gate to the gate of a same mirroring transistor, e.g., the one diode connected in the mirror current schematic. In FIG. 11 the transistors and the mirrors are not shown, nevertheless is shown a mirror current generator MI, for the diode connected MOSFET, which has geometrical parameter such that mirrors a current, reference current Iref, multiplied by an integer factor $M=2^{n-1}$ which is coupled to the terminal 113a for measuring by an ammeter 121'. Therefore, in FIG. 11 the mirror current generator MI can drive a reference current Iref which value is 3*I. In this way, when switches iSW1, iSW2, iSW3 are all closed, mirror current generator MI can drive a reference current Iref which value is 3*I, which is measured by the ammeter 121'. When there is another configuration, a smaller reference current Iref will be mirrored into the ammeter 121'. The analog current output Idac is a scaled version of the reference current Iref, therefore it is sufficient to measure the reference current for the purposes of the test, rather than picking the output like for the resistive divider, as the reference current represents in its turn a scaled measurement of the analog current output Ida.

Thus, the first test may comprise:
the logic 112 enables one reference current generator of the steering DAC current branches under the control of ATE logic 122;
the ATE 12' reads the analog reference current Iref with an ammeter 122';
the ATE 12' compares the analog current Iref read with a preset current range. If the reference current Iref is within the expected range then the test on basic components passed successfully. If the reference current Iref is out of the preset current range, a failure is asserted by the logic.

The number of ATE 12' measurements needed to test the circuit elements in the first test depends on the architecture used. For example, in this implementation, only one variable is present into the architecture: the mirror reference current, IREF. The output current IDAC, as mentioned, is just a scaled version of the mirror reference current IREF and, hence it does not need to be measured. For this reason, only one read is necessary.

Figure 12:
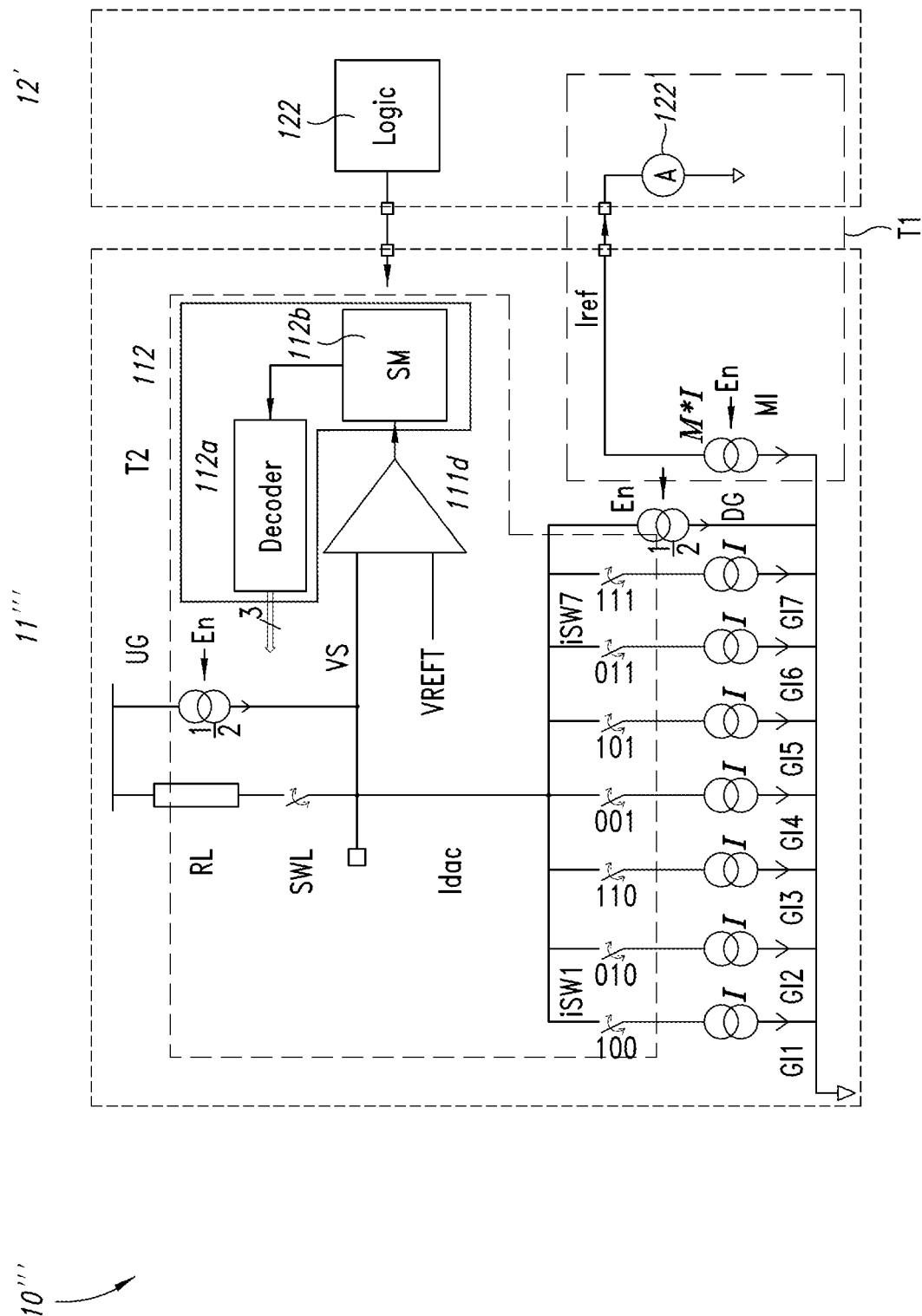
FIG. 12 is a schematic circuit representation of a test system with an electronic circuit comprising a current steering converter in a second test phase according to an embodiment.

FIG. 12 shows the overall test architecture for a 3-bit current steering DAC, which basically corresponds to the one in FIG. 11, with a greater number of current generators, as here the number of bits n is 3. Such architecture comprises components for the first test phase and the second phase. In the case shown, there are $2^{n-1}$, e.g., seven current generators GI1 ... GI7 supplying a current I with corresponding switches iSW1 ... ISW7, which selectively couple a respective current generators to an output node of the DAC labelled as VS. Also in this case the current generators GI1 ... GI7, although not explicitly shown, are obtained by current mirrors in parallel of which one of corresponding switches iSW1 ... ISW7 while the other side is the mirror generator MI, e.g., diode connected MOSFET, which is sized so to provide a reference current Iref which equals M*I, e.g., 7*I in this case. The output of the DAC VS is coupled to a comparator 111d similar to the one for test networking of FIG. 6A-7B, e.g., node VS terminal is coupled to the input of a threshold comparator 111d, which other input is coupled to a threshold voltage VREFT. This because a pullup current generator UG supplying a current I/2, e.g., half of the current I of the DAC current generators, into node VS, is coupled between VS and VDD, in parallel with a load RL, coupled to the node Vs by a load decoupling switch SWL. A corresponding pulldown generator DG supplying a current I/2 into the ground is coupled between node VS and ground, in parallel with the DAC current generators GI1 ... GI7. The two generators UG and DG and the mirror generator MI are enabled to operate by the enable signal En provided by the logic 122.

The output of the threshold comparator 111d is coupled to the logic 112, which runs a state machine 112b based on the output logic value of the threshold comparator 111d and includes the decoder 112a supply the codes commanding the switches.

The test for this embodiment includes
first test phase, verification of the Analog Basic components. Logic 122 enables (signal En) the reference current Iref for the internal current branches, e.g., generators coupled to the mirror. The reference current is read by the external ammeter. The value read is compared with an expected range. If such value is within the range then test result is good;
Second test phase: Multiplexing network testing;
firstly, a close failure test is performed. The pullup current is enabled (generator DU) and pulldown generator DG disabled. The pull up current value is I/2, half of a single current generator unit because, in case of fault, pull down must be stronger than pull up. Logic keeps all switches in OFF state. If the output of the comparator 111d goes high, result test is good;
secondly, open failure test starts. One by One, all switches iSW1 ... iSW7 are forced in ON state condition, while all the others are open. If the output of the comparator 111d is low, test result is good;
a third test phase may be also performed additionally: a test of the decoupling switch SWL from load RL;
firstly, a close failure test is performed. The pulldown current is enabled, e.g., generator DG, and generator UG disabled. The pull down current value is I/2.

Logic 112b keeps the switch SWL in OFF state. If the output of the comparator 111d goes low, result test is good;

secondly, open failure test starts. The pulldown current is enabled and UG disable (generator DG). Logic 112b keeps the switch SWL in ON state. If the output of the comparator 111d goes high, result test is good. When the test is completed, logic writes test results into a register.

Figure 13:
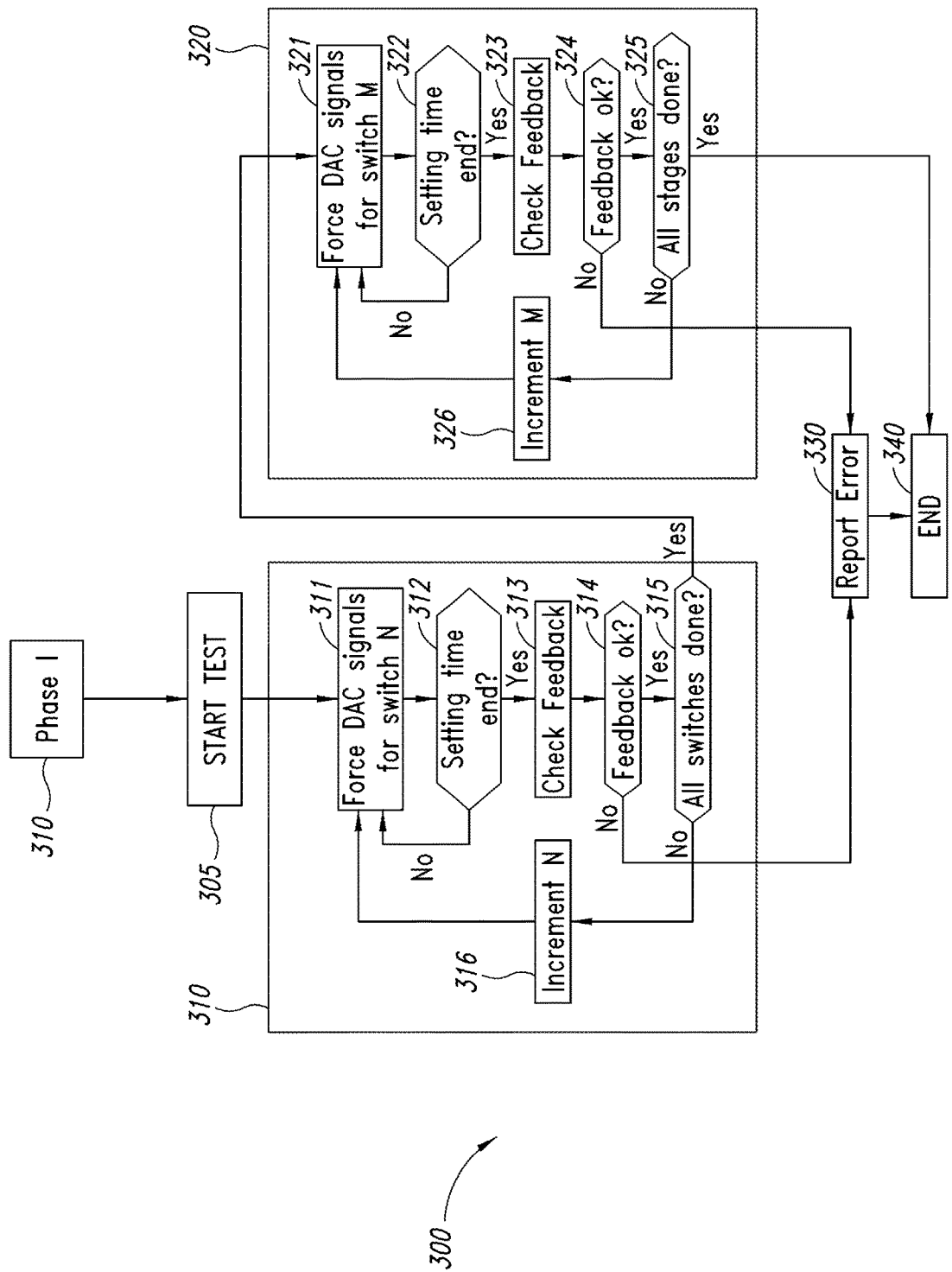
FIG. 13 is a flow diagram of an embodiment of a method for operating a system here described.

In FIG. 13 is shown a flow diagram of possible embodiment of the second test phase, the test of the switching network.

Substantially the second test phase of the switching network distinguishes between a fault open test, e.g., testing if some of the switches of the network fails to open, and fault close test, e.g., testing if some of the switches of the network fails to close.

In the fault open test (310 in FIG. 13) each switch of the switching network is separately opened and it is checked if the output matches the expected output.

In the fault close test (320 in FIG. 13) all the switches belonging to a stage of DAC are forced to open, e.g., in OFF state, and it is checked if the output matches the expected output. If the DAC comprises more stages, like in FIG. 10, each stage controlled by a different bit or group of bits of the digital code DC starting from the MSB to the LSB, the same operation is performed on the next stages, one by one. For example, in an embodiment, while one stage is being tested and its switches are forced to open, all the switches of the other stages are closed.

Thus, in FIG. 13 is shown a flow diagram illustrating an embodiment 300 of the second test phase.

With 305 is indicated the start, which takes places, after the completion of the first test phase indicated with Phase I 200. The first test phase 200 in general comprises sending given digital data TD from the automatic test equipment 12 as input of the digital to analog converter, e.g., 111' and measuring the analog output of the digital to analog converter 111' by a measuring instrument, e.g., voltmeter or ammeter depending on the electrical quantity which is the output of the digital to analog converter, in said automatic testing equipment, then checking if the measured values matches the expected conversion values for the given digital data TD. As discussed, the test phase 200 may comprise to send a plurality of data TD and performing a corresponding a plurality of measurements or reading by the measuring instruments, the number of such digital data TD and reading depending on the architecture of the DAC.

With 310 is indicated the open failure test, which includes in general forcing 311 into the DAC 111 (or 111' or 111''') digital codes DC corresponding to a given digital input value corresponding to a given switch $SW_i$ or $iSW_i$.

With 312 is indicated verifying if a given settling time has elapsed.

Only in the positive a step 313 of checking by the comparator 111d the output of the DAC 111 (or 111' or 111") is performed. Else the forcing step 312 is maintained.

In a step 314 is verified if output of the comparator 111d matches the expected logic value.

In the affirmative, in a step 315 is checked if all the switches have been tested in sequence. In the negative, index i is increased, for instance of one, and step 311 is performed for the next switch.

In the positive, control passed to the close failure test 320, which includes in general forcing 321 into the DAC 111 (or 111' or 111") a digital code DC which is configured to force a same state, e.g., open, on the switches of a given stage, SGj, j being the index of the stage. If other stages are present, the digital code DC is configured with a value which maintains them in the opposite, e.g., closed state.

With 322 is indicated verifying if a given settling time has elapsed.

Only in the positive a step 323 of checking by the comparator 111d the output of the DAC 111 (or 111' or 111") is performed. Else forcing step 312 is maintained.

In a step 324 is verified if output of the comparator 111d matches the expected logic value.

In the affirmative, in a step 325 is checked if all the stages have been tested in sequence. In the negative, index i is increased in step 326, for instance of one, and step 321 is performed for the next stage.

Clearly in case of the circuit of FIG. 5 or FIG. 11, as there is only one stage, only one iteration is performed.

Upon performing steps 314 and 324, if the result is negative, e.g., there is a fault, a step of reporting the error 330 is performed, then the test ends in an end step 340. End step 340 follows also step 326 if steps 321-324 have been performed for all the stages, e.g., DV1 and SG1 to SG4 in FIG. 10.

Thus, summing up the system for testing, 10', 10" or 10''', comprising an electronic circuit to be tested such as 11', 11" or 11''', and an automatic testing equipment, 12, 12', where said electronic circuit 11', 11" or 11''' to be tested comprises a digital to analog converter, such as 111', 111" or 111''' comprising a set of electronic components, e.g., resistors R and current generators I, also resistive switches Rsw, in particular arranged in a network, coupled to an analog reference voltage or to an analog reference current and a multiplexing network of switches 111b coupled to said set of electronic components and configured to select paths in said set of electronic components R, I on the basis of digital values DC at the input of said digital to analog converter 111', 111" supplied by a logic control module 112 comprised in said electronic circuit 11', 11", 11''', said electronic circuit 11', 11", 11''' to be tested comprising an input data link, e.g., 113b, 123b, between the automatic testing equipment 12, 12' and the logic control module 112, the system for testing being configured to perform a test of the set of electronic components in which the automatic testing equipment 12, 12' is configured to send digital data TD to control the logic module 112 inputting digital codes DC in the digital to analog converter 111', 111" and measuring the analog output of the digital to analog converter 111', 111" by a measuring instrument, e.g., the voltmeter 122 or the ammeter 122', in said automatic testing equipment 12, 12' coupled to an output, e.g., VDAC, Vin, of the electronic circuit, 10', 10", 10''', then checking if the measured values matches expected converted values for the given digital data TD, wherein said test of the digital to analog converter, 111', 111", 111''' comprises a further test of the multiplexing network of switches 111b in which said logic module 112 is configured to execute a built-in test sequence, such as in the embodiment 300, comprising supplying by said logic module 112 a sequence of digital codes DC forcing given switches of said multiplexing network of switches (111b) in a determined open or close state, said electronic circuit 11', 11", 11''' comprising a feedback circuit, substantially comparator 111d, to supply a feedback signal FB to said logic module 112, said logic module 112 being configured, on the basis of said feedback signal FB, to control an execution flow of the built-in test sequence 300 and to verify, such as in operations 324, 314, if the feedback signal FB matches an expected value for the corresponding digital code DC in the sequence of digital codes.

Regarding test time reduction, referring as before to a 10 bit DAC test time, as discussed previously, ATE 12 reads with a voltmeter or ammeter the output $2^n$ times:

the duration of each communication, T_COMM, requires typically few us (max 10 us), depending on the frequency of communication;

integrated circuit code changes requires a settling time, T_SETTL, typically of 1 us;

the duration of each ATE reading, T_READ, requires typically 1 ms.

Thus:

$$DAC_{TOTAL\ TEST\ TIME} = 2^n * (T_{COMM} + T_{SETTL} + T_{READ}) = 1024 * (1.011\ ms) = 1.035\ s$$

Test of Basic Components

The duration of the test for basic components depends on the number of analog readout ($N_{read}$) and on the time needed for ATE read ($T_{COMM} + T_{SETTL} + T_{READ}$):

in case of resistive DAC, the minimum number of readout $N_{read}$ needed to test basic components is three: one read out to check voltage reference (max code), one read out to check ground reference (minimum code), one read out to check resistor divider ratio selecting an intermediate conversion value (middle code). The total time required to test basic components is:

$$T_{BasicComp,resDAC} = N_{read} * (T_{COMM} + T_{SETTL} + T_{READ}) = 3 * (1.011\ ms) = 3.033\ ms$$

in case of current steering DAC, the minimum number of readout $N_{read}$ needed to test basic components is one: readout of current reference. The total time required to test basic components is:

$$T_{BasicComp,currDAC} = N_{read} * (T_{COMM} + T_{SETTL} + T_{READ}) = 1 * (1.011\ ms) = 1.011\ ms$$

The duration of multiplexing network test depends on the number of stages of DAC architecture, indicated with G, on the number of bits for each stage m, l, . . . , on the number of wires selectable for each resistance $k_x$ and on the time needed for one cycle of selftest $T_{cycle}$. This formula can be a good estimation for multiplying network testime calculation:

$$T_{MuxNet} = (T_{close,1} + T_{open,1}) + (T_{close,2} + T_{open,2}) + \ldots = (1*T_{cycle} + 2^m*T_{cycle}*k_1) + (1*T_{cycle} + 2^l*T_{cycle}*k_2) + \ldots\ T_{MuxNet} = G*T_{cycle} + (2^m*T_{cycle}*k_1) + (2^l*T_{cycle}*k_2) + \ldots$$

DAC total test time: first embodiment

Considering 3 bit resistive DAC and $T_{cycle}$=2.375 us:

$$DAC_{TOTAL\ TEST\ TIME} = T_{BasicComp} + T_{MuxNet} = N_{read} * (T_{COMM} + T_{SETTL} + T_{READ}) + 1*T_{cycle} 2^3*T_{cycle} = 3*(1.011\ ms) + 2.375\ us + 8*2.375\ us = 3.05\ ms$$

DAC total test time: second embodiment

Considering the 6 bit distributed DAC 111' of FIG. 9, 2 wires to be tested for first stage and 1 for the second stage, a $T_{cycle}$=2.375 us:

$$DAC_{TOTAL\ TEST\ TIME} = T_{BasicComp} + T_{MuxNet} = N_{read} * (T_{COMM} + T_{SETTL} + T_{READ}) + 4*T_{cycle} + (2^4*T_{cycle}*2) + (2^2*T_{cycle} = 3*(1.011\ ms) + 4*2.375\ us + 32*2.375\ us + 4*2.375\ us = 3.13\ ms$$

DAC total test time: third embodiment

Considering 3 bit current steering DAC and $T_{cycle}$=2.375 us:

$$DAC_{TOTAL\ TEST\ TIME} = T_{BasicComp} + T_{MuxNet} = N_{read} * (T_{COMM} + T_{SETTL} + T_{READ}) + 1*T_{cycle} + 2^3*T_{cycle} = 1*(1.011\ ms) + 2.375\ us + 8*2.375\ us = 3.06\ ms$$

DAC total test time: 10 bit resistive DAC

Considering 10 bit resistive DAC with one stage (worst case for multiplying network test time), a $T_{cycle}$=2.375 us, the total test time will be:

$$DAC_{TOTAL\ TEST\ TIME} = T_{BasicComp} + T_{MuxNet} = N_{read} * (T_{COMM} + T_{SETTL} + T_{READ}) + 1*T_{cycle} + 2^{10}*T_{cycle} = 3*1.011\ ms + 2.375\ us + 1024*2.375\ us = 5.47\ ms$$

Comparison of test time: known solution VS proposed solution

In conclusion, even in worst case, the reduction of test time of the proposed solution with respect to the know solution is about three order of magnitude for each DAC. Considering the assumptions presented before, for 10 bit DAC:

$$DAC_{TOTAL\ TEST\ TIME_{KNOWN\ SOL}} = 1.035\ s$$

$$DAC_{TOTAL\ TEST\ TIME_{PROPOSED\ SOL}}(max) = 5.47\ ms$$

The described solution thus may have several advantages with respect to the prior art solutions.

With the solution proposed test and measure the DAC circuitry, in order to better screen manufacturing defects are possible, reducing the time needed to perform the test, with the aim of reducing testing cost.

The solution described allows by an internal built in self-test to avoid interaction with external instrumentation. Furthermore, self-test may be highly configurable by user (number of switches to be tested, speed, and others parameters can be configurable).

The solution described allows detailed information to better localize the defects found.

Of course, without prejudice to the principle of the disclosure, the details of construction and the embodiments may vary widely with respect to what has been described and illustrated herein purely by way of example, without thereby departing from the scope of the present disclosure, as defined by the ensuing claims.

A system for testing which may be summarized as including an electronic circuit to be tested (11; 11'; 11"; 11''') and an automatic testing equipment (12; 12'), said electronic circuit (11; 11'; 11"; 11''') to be tested includes a digital to analog converter (111; 111'; 111"), including a set of electronic components (R; I), in particular arranged in a network, coupled to an analog reference voltage or to an analog reference current and a multiplexing network of switches (111b) coupled to said set of electronic components (R; I) and configured to select paths in said set of electronic components (R; I) on the basis of digital values (DC) at the input of said digital to analog converter (111; 111'; 111") supplied by a logic control module (112) included in said electronic circuit (11; 11'; 11"; 11'''), said electronic circuit (11; 11'; 11"; 11''') to be tested including an input data link (113b, 123b) between the automatic testing equipment (20, 20', 20") and the logic control module (112), the system for testing being configured to perform a test of the set of electronic components (R; I) in which the automatic testing equipment (20, 20', 20") is configured to send digital data (TD) to control the logic module (112) inputting digital codes (DC) in the digital to analog converter (111; 111'; 111") and measuring the analog output of the digital to analog converter (111; 111'; 111") by a measuring instrument (122; 122') in said automatic testing equipment (12; 12') coupled to an output (VDAC, Vin) of the electronic circuit (10, 10', 10'"), then checking if the measured values matches expected converted values for the given digital data (TD), wherein said test of the digital to analog converter (111; 111'; 111") including a further test of the multiplexing network of switches (111b) in which said logic module (112) is configured to execute a built-in test sequence (300) including supplying by said logic module (112) a sequence of digital codes (DC) forcing given switches of said multiplexing network of switches (111b) in a determined open or close state, said electronic circuit (11'; 11"; 11'") including a feedback circuit (111d) to supply a feedback signal (FB) to said logic module (112), said logic module (112) being configured, on the basis of said feedback signal (FB), to control an execution flow of the built-in test sequence (300)) and to verify (324, 325) if the feedback signal (TB) matches an expected value for the corresponding digital code (DC) in the sequence of digital codes.

Said feedback circuit (111d) may include a comparator (111d) configured to receive as input the analog output of the digital to analog converter (111; 111'; 111") and to compare it against a given comparator threshold to supply said feedback signal (FB) as logic signal, said logic module (112) being configured to check if the logic value at the output of the comparator (111d) of the feedback signal (FB) matches an expected logic value for the corresponding digital code (DC) in the sequence of digital codes.

Said system for testing may be configured to perform a test (200) of the set of electronic components (R; I) in which a logic module (122) of the automatic test equipment (12) may be configured to set one or more digital test data (TD) to be converted in corresponding expected analog signal (VDAC) and send to said logic module (112); the logic module (112) of the electronic circuit (11'; 11"; 11'") being configured to receive said digital test data (TD) and provide a corresponding digital code (DC) to the input analog converter (111; 111'; 111"); the measuring instrument (122; 122'), in particular a voltage measuring or current measuring instrument, of the automatic test equipment (12) may be configured to measure the output analog signal (VDAC); automatic test equipment (12) may be configured to compare the measurement of the measuring instrument (122; 122') with an expected range of values of the output analog signal (VDAC) for the corresponding digital code (DC) and in case the measurement lies inside said expected range of values evaluate the corresponding result as passed test for the corresponding digital code (DC) otherwise evaluate as failed test.

Said further test of the multiplexing network of switches may include performing an open failure test (310) and a close failure test (320).

Said open failure test (310) may include forcing (311) into the digital to analog converter (111; 111'; 111") digital codes DC corresponding to a given digital input value corresponding to a given switch ($SW_i$, $iSW_i$), checking (313), in particular if (312) a given settling time has elapsed, by the comparator (111d) the output of the digital to analog converter (111; 111'; 111"), verifying (314) if the feedback signal (FB) output of the comparator (111d) matches the expected logic value, in the positive case, checking (315) if all the switches ($SW_i$, $iSW_i$) of the multiplexing network of switches (111b) have been tested in sequence, in the negative case, passing to perform said checking (313) on the next switch in the sequence, in the positive case, control being passed to a next step, in particular the close failure test (320), or to the end of said open failure test (310), and said close failure test (320) may include forcing (321) into the digital to analog converter (111; 111'; 111") a digital code DC which may be configured to force a same state, in particular open, on the switches of a given stage (SGj) of the multiplexing network of switches (111b), if the multiplexing network of switches (111b) may include other stages said digital code (DC) being configured with a value which maintains the switches of said other stages in the opposite, in particular closed, state, checking (323), in particular if (322) a given settling time has elapsed, by the comparator (111d) the output of the digital to analog converter (111; 111'; 111"), verifying (324) if the feedback signal (FB) output of the comparator (111d) matches the expected logic value, in the positive case, checking (325) if all the stages of the multiplexing network of switches (111b) have been tested in sequence, in the negative case (325), passing to perform said checking (323) on the next stage in the sequence, in the positive case, control being passed to a next step, in particular the open failure test (310), or to the end of said open failure test (320).

A pullup current generator (111e) may be coupled between the power supply (VDD) and the input node (VS) of the comparator (111d), which may be coupled to the output of the digital to analog converter (111; 111'; 111") said pullup current generator (111e) being enabled at the beginning of said open failure test (310) and close failure test (320) by said logic circuit (112), said pullup current generator (111e) being configured to pull the input node (111e) over the threshold voltage if the multiplexing network of switches (111b) is an open circuit path with respect to ground (GND), in order to change the logic state of the feedback signal (FB) with respect to the network of switch (111b) setting a low impedance path to ground (GND) under the control of said digital code (DC).

Said digital to analog converter (111; 111'; 111") may include a resistive digital analog converter.

Said digital to analog converter (111; 111'; 111") may include a resistive digital to analog converter including a plurality of stages.

Said digital to analog converter (111; 111'; 111") may include a current steering digital to analog converter.

Said logic module (112) may be configured to send the result of said step of verifying (324, 325) if the feedback signal (TB) matches an expected value for the corresponding digital code (DC) in the sequence of digital codes to said automatic test equipment (12), in particular at the completion of the built-in sequence, in particular the logic module (112) may include a register to store said results during the execution of the built-in sequence and being configured to evaluate if test is passed or failed on the results stored at the end of the test of the multiplexing network of switches (111b).

An electronic circuit to be tested may be summarized as including being configured to operate in the system.

A method for operating a system for testing, may be summarized as including performing a test of the set of electronic components (R; I) in sending from the automatic testing equipment (20, 20', 20") digital data (TD) to control the logic module (112) inputting digital codes (DC) in the digital to analog converter (111; 111'; 111") and measuring (122; 122') the analog output of the digital to analog converter (111; 111'; 111") in said automatic testing equipment (12), then checking if the measured values matches expected converted values for the given digital data (TD), wherein said test of the digital to analog converter (111; 111'; 111") includes a further test of the multiplexing network of switches (111b) including executing at said logic module (112) a built-in test sequence (300) including supplying a sequence of digital codes (DC) forcing given switches of said multiplexing network of switches (111b) in a determined open or close state, supplying a feedback signal (FB) to said logic module (112), on the basis of said feedback signal (FB), controlling an execution flow of the built-in test sequence (300) and verifying (324, 325) if the feedback signal (TB) matches an expected value for the corresponding digital code (DC) in the sequence of digital codes.

Said method may include comparing the analog output of the digital to analog converter (111; 111'; 111") against a given comparator threshold to supply said feedback signal (FB) as logic signal, checking (112) if the logic value of the feedback signal (FB) matches an expected logic value for the corresponding digital code (DC) in the sequence of digital codes.

The method may include performing a test (200) of the set of electronic components (R; I) including setting one or more digital test data (TD) to be converted in corresponding expected analog signal (VDAC) at a logic module (122) of the automatic test equipment (12) and sending to said logic module (112); receiving at the logic module (112) of the electronic circuit (10) said digital test data (TD) and providing a corresponding digital code (DC) to the input of the analog to digital converter (111; 111'; 111"); measuring (122; 122') by the measuring instrument, in particular a voltage measuring or current measuring, of the automatic test equipment (12) the output analog signal (VDAC); comparing at the automatic test equipment (12) the measurement of the measuring instrument (122; 122') with an expected range of values of the output analog signal (VDAC) for the corresponding digital code (DC) and in case the measurement lies inside said expected range of values evaluate the corresponding result as passed test for the corresponding digital code (DC) otherwise evaluate as failed test.

Said further test of the multiplexing network of switches (111b) may include performing an open failure test (310) and a close failure test (320).

Said open failure test (310) may include forcing (311) into the digital to analog converter (111; 111'; 111") digital codes DC corresponding to a given digital input value corresponding to a given switch (SW$_i$, iSW$_i$), checking (313), in particular if (312) a given settling time has elapsed, by the comparator (111d) the output of the digital to analog converter (111; 111'; 111"), verifying (314) if the feedback signal (FB) output of the comparator (111d) matches the expected logic value, in the positive case, checking (315) if all the switches (SW$_i$, iSW$_i$) of the multiplexing network of switches (111b) have been tested in sequence, in the negative case, passing to perform said checking (313) on the next switch in the sequence, in the positive case, control being passed to a next step, in particular the close failure test (320), or to the end of said open failure test (310), and said close failure test (320) may include forcing (321) into the digital to analog converter (111; 111'; 111") a digital code DC which may be configured to force a same state, in particular open, on the switches of a given stage (SGj) of the multiplexing network of switches (111b), if the multiplexing network of switches (111b) may include other stages said digital code (DC) being configured with a value which maintains the switches of said other stages in the opposite, in particular closed, state, checking (323), in particular if (322) a given settling time has elapsed, by the comparator (111d) the output of the digital to analog converter (111; 111'; 111"), verifying (324) if the feedback signal (FB) output of the comparator (111d) matches the expected logic value, in the positive case, checking (325) if all the stages of the multiplexing network of switches (111b) have been tested in sequence, in the negative case (325), passing to perform said checking (323) on the next stage in the sequence, in the positive case, control being passed to a next step, in particular the open failure test (310), or to the end of said open failure test (320).

A computer program product that can be loaded into the memory of at least one computer and may be summarized as including parts of software code that are able to execute the steps of the method when the product is run on at least one computer.

In an embodiment, a device comprises: a digital-to-analog converter (DAC) having a switching network, wherein the DAC, in operation, generates analog output signals in response to input codes of a set of input codes of the DAC; and built-in-self-test (BIST) circuitry coupled to the DAC, wherein the BIST circuitry, in a self-test mode of operation: sequentially applies codes of a determined subset of codes of the set of input codes to test the plurality of switches, the determined subset of codes having fewer codes than the set of input codes; detects failures of switches of the plurality of switches based on responses of the DAC to the applied codes; and in response to detecting a failure of a switch, generates a signal indicating a failure of the switching network. In an embodiment, the BIST circuitry, in the self-test mode of operation: controls the sequential applying of codes of the determined subset of codes based on responses of the DAC to applied codes. In an embodiment, the BIST circuitry, in the self-test mode of operation: discontinues the applying of codes of the determined set of codes in response to detecting a failure of a switch based on a response to an applied code. In an embodiment, the BIST circuitry, in the self-test mode of operation: performs an open-failure test of the switches of the plurality of switches, the open-failure test including: applying a code of the determined subset of codes to the DAC to open all of the switches of the plurality of switches; detecting a failure of a switch of the plurality of switches to open in response to the applied code; and generating an indication of a failure of the open-failure test in response to detecting a failure of a switch of the plurality of switch to open in response to the applied code. In an embodiment, the BIST circuitry, in the self-test mode of operation: performs a closed-failure test of the switches of the plurality of switches, the closed-failure test including, sequentially for one or more switches of the plurality of switches: applying a code of the determined subset of codes to the DAC to close a switch of the plurality of switches and to open the other switches of the plurality of switches; detecting a failure of the switch to close in response to the applied code; and generating an indication of a failure of the closed-failure test in response to detecting a failure of the switch of the plurality of switch to close in response to the applied code. In an embodiment, the BIST circuitry, in the self-test mode of operation: performs an open-failure test of the switches of the plurality of switches, the open-failure test including: applying a code of the determined subset of codes to the DAC to open all of the switches of the plurality of switches; detecting a failure of a switch of the plurality of switches to open in response to the applied code; and generating an indication of a failure of the open-failure test in response to detecting a failure of a switch of the plurality of switch to open in response to the applied code; and performs a closed-failure test of the switches of the plurality of switches, the closed-failure test including, sequentially for one or more switches of the plurality of switches: applying a code of the determined subset of codes to the DAC to close a switch of the plurality of switches and to open the other switches of the plurality of switches; detecting a failure of the switch to close in response to the applied code; and generating an indication of a failure of the closed-failure test in response to detecting a failure of the switch of the plurality of switch to close in response to the applied code. In an embodiment, the BIST circuitry, in the self-test mode of operation, performs the open-failure test before performing the closed failure test. In an embodiment, the BIST circuitry, in the self-test mode of operation: performs an open-failure test of the switches of the plurality of switches, the open-failure test including: applying a code of the determined subset of codes to the DAC to open all of the switches of the plurality of switches; detecting a failure of a switch of the plurality of switches to open in response to the applied code; and generating an indication of a failure of the open-failure test in response to detecting a failure of a switch of the plurality of switch to open in response to the applied code; and selectively performs a closed-failure test of the plurality of switches based on a result of the open-failure test, the closed-failure test including, sequentially for one or more switches of the plurality of switches: applying a code of the determined subset of codes to the DAC to close a switch of the plurality of switches and to open the other switches of the plurality of switches; detecting a failure of the switch to close in response to the applied code; and generating an indication of a failure of the closed-failure test in response to detecting a failure of the switch of the plurality of switch to close in response to the applied code. In an embodiment, the BIST circuitry comprises: a comparator, which, in operation, compares a threshold value with an analog response of the DAC to an applied code; and generates a logic signal based on a result of the comparing of the threshold value with the analog response of the DAC, wherein the BIST circuitry, in operation, detects a failure of a switch of the plurality of switches in response to a value of the logic signal being different from an expected value of the logic signal corresponding to the applied code. In an embodiment, the BIST circuitry comprises: a current generator, coupled between a supply voltage node and an input node of the comparator, the input node of the comparator being coupled to an analog output of the DAC, wherein the BIST circuitry, in the BIST mode of operation, selectively enables the current generator. In an embodiment, the device comprises: an interface coupled to the DAC and to the BIST circuitry, wherein, in operation: the BIST circuitry receives digital test data via the interface and applies a test code to the DAC based on the received digital test data; and the DAC generates an analog result based on the applied test code and outputs the analog result via the interface. In an embodiment, in operation, the interface couples the device to automatic test equipment, receives the digital test data from the automatic test equipment, and outputs the analog result to the automatic test equipment. In an embodiment, the DAC comprises a resistive DAC. In an embodiment, the DAC comprises a current steering DAC. In an embodiment, the switching network comprises a plurality of stages, each stage of the plurality of stages including respective switches of the plurality of switches. In an embodiment, the BIST circuitry, in the self-test mode of operation: performs an open-failure test of the switches of a stage of the plurality of stages, the open-failure test including: applying a code of the determined subset of codes to the DAC to: close all of the switches of other stages of the plurality of stages; and open all of the switches of the stage of the plurality of stages; detecting a failure of a switch of the switches of the stage to open in response to the applied code; and generating an indication of a failure of the open-failure test in response to detecting a failure of a switch of the stage to open in response to the applied code. In an embodiment, the BIST circuitry, in the self-test mode of operation: performs a closed-failure test of the switches of a stage of the plurality of stages, the closed-failure test including, sequentially for one or more switches of the stage: applying a code of the determined subset of codes to the DAC to: close all of the switches of other stages of the plurality of stages; close a switch of the stage; and open the other switches of the stage; detecting a failure of the switch to close in response to the applied code; and generating an indication of a failure of the closed-failure test in response to detecting a failure of the switch of the plurality of switch to close in response to the applied code.

In an embodiment, a system comprises: an automatic testing device (ATE); an interface; and a digital-to-analog converter (DAC) coupled to the ATE via the interface, wherein the DAC, in operation, generates analog output signals in response to input codes of a set of input codes of the DAC, the DAC including: a switching network having a plurality of switches; and built-in-self-test (BIST) circuitry coupled to the switching network, wherein the BIST circuitry, in a self-test mode of operation of the DAC: sequentially applies codes of a determined subset of codes of the set of input codes to test the plurality of switches, the determined subset of codes having fewer codes than the set of input codes; detects failures of switches of the plurality of switches based on responses of the DAC to the applied codes; and in response to detecting a failure of a switch, generates a signal indicating a failure of the switching network. In an embodiment, the BIST circuitry, in the self-test mode of operation of the DAC: controls the sequential applying of codes of the determined subset of codes based on responses of the DAC to applied codes. In an embodiment, the BIST circuitry comprises: a comparator, which, in operation, compares a threshold value with an analog response of the DAC to an applied code; and generates a logic signal based on a result of the comparing of the threshold value with the analog response of the DAC, wherein the BIST circuitry, in operation, detects a failure of a switch of the plurality of switches in response to a value of the logic signal being different from an expected value of the logic signal corresponding to the applied code. In an embodiment, in operation, the BIST circuitry receives digital test data from the ATE via the interface and applies a test code to the DAC based on the received digital test data; and the DAC generates an analog result based on the applied test code and outputs the analog result to the ATE via the interface. In an embodiment, in operation, the BIST circuitry generates a test-result signal indicative of results of the testing of the plurality of switches and outputs the test result signal to the ATE via the interface. In an embodiment, the switching network comprises a plurality of stages, each stage of the plurality of stages including respective switches of the plurality of switches. In an embodiment, the BIST circuitry, in the self-test mode of operation: performs an open-failure test of the switches of a stage of the plurality of stages, the open-failure test including: applying a code of the determined subset of codes to the DAC to: close all of the switches of other stages of the plurality of stages; and open all of the switches of the stage of the plurality of stages; detecting a failure of a switch of the switches of the stage to open in response to the applied code; and generating an indication of a failure of the open-failure test in response to detecting a failure of a switch of the stage to open in response to the applied code. In an embodiment, the BIST circuitry, in the self-test mode of operation: performs a closed-failure test of the switches of a stage of the plurality of stages, the closed-failure test including, sequentially for one or more switches of the stage: applying a code of the determined subset of codes to the DAC to: close all of the switches of other stages of the plurality of stages; close a switch of the stage; and open the other switches of the stage; detecting a failure of the switch to close in response to the applied code; and generating an indication of a failure of the closed-failure test in response to detecting a failure of the switch of the plurality of switch to close in response to the applied code.

In an embodiment, a method comprises: sequentially applying to a digital-to-analog converter (DAC), using built-in-self-test (BIST) circuitry of the DAC, codes of a determined subset of codes of a set of inputs codes of the DAC, the determined subset of codes having fewer codes than the set of input codes of the DAC; detecting, using the BIST circuitry, failures of switches of a plurality of switches of a switching network of the DAC based on responses of the DAC to the applied codes of the determined subset of codes; and in response to detecting a failure of a switch of the plurality of switches, generating, using the BIST circuitry, an indication of a failure of the switching network of the DAC. In an embodiment, the method comprises: controlling the sequential applying of codes of the determined subset of codes based on responses of the DAC to applied codes. In an embodiment, the detecting failures comprises: comparing a threshold value with an analog response of the DAC to an applied code, generating a logic signal; and detecting a failure of a switch of the plurality of switches in response to a value of the logic signal being different from an expected value of the logic signal corresponding to the applied code. In an embodiment, the method comprises: receiving, by the BIST circuitry, digital test data from an automatic testing device (ATE); applying, by the BIST circuitry, a test code to the DAC based on the received digital test data; generating, by the DAC, an analog result based on the applied test code; and comparing, by the ATE, the analog result with an expected analog result. In an embodiment, the switching network comprises a plurality of stages, each stage of the plurality of stages including respective switches of the plurality of switches. In an embodiment, the method comprises: performing an open-failure test of the switches of a stage of the plurality of stages, the performing the open-failure test including: applying a code of the determined subset of codes to the DAC to: close all of the switches of other stages of the plurality of stages; and open all of the switches of the stage of the plurality of stages; detecting a failure of a switch of the switches of the stage to open in response to the applied code; and generating an indication of a failure of the open-failure test in response to detecting a failure of a switch of the stage to open in response to the applied code. In an embodiment, the method comprises: performing a closed-failure test of the switches of a stage of the plurality of stages, the closed-failure test including, sequentially for one or more switches of the stage: applying a code of the determined subset of codes to the DAC to: close all of the switches of other stages of the plurality of stages; close a switch of the stage; and open the other switches of the stage; detecting a failure of the switch to close in response to the applied code; and generating an indication of a failure of the closed-failure test in response to detecting a failure of the switch of the plurality of switch to close in response to the applied code. In an embodiment, the method comprising: determining the determined subset of codes.

In an embodiment, a non-transitory computer-readable medium's contents cause built-in-self-test (BIST) circuitry of a digital-to-analog converter (DAC) to perform a method, the method comprising: sequentially applying to codes of a determined subset of codes of a set of inputs codes of the DAC to an input of the DAC, the determined subset of codes having fewer codes than the set of input codes of the DAC; detecting failures of switches of a plurality of switches of a switching network of the DAC based on responses of the DAC to the applied codes of the determined subset of codes; and in response to detecting a failure of a switch of the plurality of switches, generating an indication of a failure of the switching network of the DAC. In an embodiment, the method comprises: controlling the sequential applying of codes of the determined subset of codes based on responses of the DAC to applied codes. In an embodiment, the detecting failures comprises: comparing a threshold value with an analog response of the DAC to an applied code, generating a logic signal; and detecting a failure of a switch of the plurality of switches in response to a value of the logic signal being different from an expected value of the logic signal corresponding to the applied code. In an embodiment, the contents comprise instructions executed by the BIST.

Some embodiments may take the form of or comprise computer program products. For example, according to one embodiment there is provided a computer readable medium comprising a computer program adapted to perform one or more of the methods or functions described above. The medium may be a physical storage medium, such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the methods and/or functionality may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
    a digital-to-analog converter (DAC) having a switching network including a plurality of switches, wherein the DAC, in operation, generates analog output signals in response to input codes of a set of input codes of the DAC; and built-in-self-test (BIST) circuitry coupled to the DAC, wherein the BIST circuitry, in a self-test mode of operation:
sequentially applies codes of a determined subset of codes of the set of input codes to test the plurality of switches, the determined subset of codes having fewer codes than the set of input codes;
detects failures of switches of the plurality of switches based on responses of the DAC to the applied codes; and
in response to detecting a failure of a switch of the plurality of switches, generates a signal indicating a failure of the switching network, wherein the BIST circuitry, in the self-test mode of operation;
performs an open-failure test of the plurality of switches;
generates an indication of a failure of the open-failure test based on a result of the open-failure test;
selectively performs a closed-failure test of the plurality of switches based on the result of the open-failure test; and
generates an indication of a failure of the closed-failure test based on a result of the closed-failure test.

2. The device of claim 1, wherein the BIST circuitry, in the self-test mode of operation:
controls the sequential applying of codes of the determined subset of codes based on responses of the DAC to applied codes.

3. The device of claim 2, wherein the BIST circuitry, in the self-test mode of operation: discontinues the applying of codes of the determined set of codes in response to detecting a failure of a switch of the plurality of switches based on a response to an applied code.

4. The device of claim 1, wherein the open-failure test includes:
applying a code of the determined subset of codes to the DAC to open all of the switches of the plurality of switches;
detecting a failure of a switch of the plurality of switches to open in response to the applied code; and
generating the indication of a failure of the open-failure test in response to detecting a failure of a switch of the plurality of switches to open in response to the applied code.

5. The device of claim 1, wherein the closed-failure test includes, sequentially for one or more switches of the plurality of switches:
applying a code of the determined subset of codes to the DAC to close a switch of the plurality of switches and to open the other switches of the plurality of switches;
detecting a failure of the switch to close in response to the applied code; and
generating the indication of a failure of the closed-failure test in response to detecting a failure of the switch of the plurality of switch to close in response to the applied code.

6. The device of claim 1, wherein the open-failure test includes:
applying a code of the determined subset of codes to the DAC to open all of the switches of the plurality of switches;
detecting a failure of a switch of the plurality of switches to open in response to the applied code; and
generating an indication of a failure of the open-failure test in response to detecting a failure of a switch of the plurality of switches to open in response to the applied code; and
the closed-failure test includes, sequentially for one or more switches of the plurality of switches:
applying a code of the determined subset of codes to the DAC to close a switch of the plurality of switches and to open the other switches of the plurality of switches;
detecting a failure of the switch to close in response to the applied code; and
generating an indication of a failure of the closed-failure test in response to detecting a failure of the switch of the plurality of switches to close in response to the applied code.

7. The device of claim 1, wherein the BIST circuitry comprises:
a comparator, which, in operation,
compares a threshold value with an analog response of the DAC to an applied code; and
generates a logic signal based on a result of the comparing of the threshold value with the analog response of the DAC, wherein the BIST circuitry, in operation, detects a failure of a switch of the plurality of switches in response to a value of the logic signal being different from an expected value of the logic signal corresponding to the applied code.

8. The device according to claim 7, wherein the BIST circuitry comprises:
a current generator, coupled between a supply voltage node and an input node of the comparator, the input node of the comparator being coupled to an analog output of the DAC, wherein the BIST circuitry, in the self-test mode of operation, selectively enables the current generator.

9. The device of claim 1, comprising:
an interface coupled to the DAC and to the BIST circuitry, wherein, in operation:
the BIST circuitry receives digital test data via the interface and applies a test code to the DAC based on the received digital test data; and
the DAC generates an analog result based on the applied test code and outputs the analog result via the interface.

10. The device of claim 9, wherein, in operation, the interface couples the device to automatic test equipment, receives the digital test data from the automatic test equipment, and outputs the analog result to the automatic test equipment.

11. The device of claim 1, wherein the DAC comprises a resistive DAC.

12. The device of claim 1, wherein the DAC comprises a current steering DAC.

13. The device of claim 1, wherein the switching network comprises a plurality of stages, each stage of the plurality of stages including respective switches of the plurality of switches.

14. The device of claim 13, wherein the BIST circuitry, in the self-test mode of operation:
performs an open-failure test of the switches of a stage of the plurality of stages, the open-failure test of the stage of the plurality of switches including:
applying a code of the determined subset of codes to the DAC to:
close all of the switches of other stages of the plurality of stages; and open all of the switches of the stage of the plurality of stages;
detecting a failure of a switch of the switches of the stage to open in response to the applied code; and
generating an indication of a failure of the open-failure test in response to detecting a failure of a switch of the stage to open in response to the applied code.

15. The device of claim 13, wherein the BIST circuitry, in the self-test mode of operation:
performs a closed-failure test of the switches of a stage of the plurality of stages, the closed-failure test of the stage of the plurality of stages including, sequentially for one or more switches of the stage:
applying a code of the determined subset of codes to the DAC to:
close all of the switches of the plurality of switches of other stages of the plurality of stages;
close a switch of the plurality of switches of the stage; and
open the other switches of the plurality of switches of the stage;
detecting a failure of the switch of the plurality of switches of the stage to close in response to the applied code; and
generating an indication of a failure of the closed-failure test in response to detecting a failure of the switch of the plurality of switches of the stage to close in response to the applied code.

16. A system, comprising:
an automatic testing device (ATE);
an interface; and
a digital-to-analog converter (DAC) coupled to the ATE via the interface, wherein the DAC, in operation, generates analog output signals in response to input codes of a set of input codes of the DAC, the DAC including:
a switching network having a plurality of switches; and
built-in-self-test (BIST) circuitry coupled to the switching network, wherein the BIST circuitry, in a self-test mode of operation of the DAC:
sequentially applies codes of a determined subset of codes of the set of input codes to test the plurality of switches, the determined subset of codes having fewer codes than the set of input codes;
detects failures of switches of the plurality of switches based on responses of the DAC to the applied codes; and
in response to detecting a failure of a switch of the plurality of switches, generates a signal indicating a failure of the switching network, wherein the BIST circuitry, in the self-test mode of operation:
perform an open-failure test of the plurality of switches;
generates an indication of a failure of the open-failure test based on a result of the open-failure test;
selectively performs a closed-failure test of the plurality of switches based on the result of the open-failure test; and
generates an indication of a failure of the closed-failure test based on a result of the closed-failure test.

17. The system of claim 16, wherein the BIST circuitry, in the self-test mode of operation of the DAC:
controls the sequential applying of codes of the determined subset of codes based on responses of the DAC to applied codes.

18. The system of claim 16, wherein the BIST circuitry comprises:
a comparator, which, in operation,
compares a threshold value with an analog response of the DAC to an applied code; and
generates a logic signal based on a result of the comparing of the threshold value with the analog response of the DAC, wherein the BIST circuitry, in operation, detects a failure of a switch of the plurality of switches in response to a value of the logic signal being different from an expected value of the logic signal corresponding to the applied code.

19. The system of claim 16, wherein, in operation,
the BIST circuitry receives digital test data from the ATE via the interface and applies a test code to the DAC based on the received digital test data; and
the DAC generates an analog result based on the applied test code and outputs the analog result to the ATE via the interface.

20. The system of claim 19, wherein, in operation,
the BIST circuitry generates a test-result signal indicative of results of the testing of the plurality of switches and outputs the test result signal to the ATE via the interface.

21. The system of claim 20, wherein the switching network comprises a plurality of stages, each stage of the plurality of stages including respective switches of the plurality of switches.

22. The system of claim 21, wherein the BIST circuitry, in the self-test mode of operation: performs an open-failure test of the switches of a stage of the plurality of stages, the open-failure test of the stage of the plurality of stages including:
applying a code of the determined subset of codes to the DAC to:
close all of the switches of the plurality of switches of other stages of the plurality of stages; and
open all of the switches of the plurality of switches of the stage of the plurality of stages;
detecting a failure of a switch of the plurality of switches of the stage to open in response to the applied code; and
generating an indication of a failure of the open-failure test in response to detecting a failure of a switch of the plurality of switches of the stage to open in response to the applied code.

23. The system of claim 21, wherein the BIST circuitry, in the self-test mode of operation:
performs a closed-failure test of the switches of a stage of the plurality of stages, the closed-failure test of the stage of the plurality of stages including, sequentially for one or more switches of the stage:
applying a code of the determined subset of codes to the DAC to:
close all of the switches of other stages of the plurality of stages;
close a switch of the stage; and
open the other switches of the stage;
detecting a failure of the switch of the stage to close in response to the applied code; and
generating an indication of a failure of the closed-failure test in response to detecting a failure of the switch of the stage to close in response to the applied code.

24. A method, comprising:
sequentially applying to a digital-to-analog converter (DAC), using built-in-self-test (BIST) circuitry of the DAC, codes of a determined subset of codes of a set of inputs codes of the DAC, the determined subset of codes having fewer codes than the set of input codes of the DAC;
detecting, using the BIST circuitry, failures of switches of a plurality of switches of a switching network of the DAC based on responses of the DAC to the applied codes of the determined subset of codes; and
in response to detecting a failure of a switch of the plurality of switches, generating, using the BIST circuitry, an indication of a failure of the switching network of the DAC, wherein the method includes:
performing an open-failure test of the plurality of switches;
generating an indication of a failure of the open-failure test based on a result of the open-failure test;
selectively performing a closed-failure test of the plurality of switches based on the result of the open-failure test; and
generating an indication of a failure of the closed-failure test based on a result of the closed-failure test.

25. The method of claim 24, comprising:
controlling the sequential applying of codes of the determined subset of codes based on responses of the DAC to applied codes.

26. The method of claim 24, wherein the detecting failures comprises:
comparing a threshold value with an analog response of the DAC to an applied code, generating a logic signal; and
detecting a failure of a switch of the plurality of switches in response to a value of the logic signal being different from an expected value of the logic signal corresponding to the applied code.

27. The method of claim 26, comprising:
receiving, by the BIST circuitry, digital test data from an automatic testing device (ATE);
applying, by the BIST circuitry, a test code to the DAC based on the received digital test data;
generating, by the DAC, an analog result based on the applied test code; and
comparing, by the ATE, the analog result with an expected analog result.

28. The method of claim 24, wherein the switching network comprises a plurality of stages, each stage of the plurality of stages including respective switches of the plurality of switches.

29. The method of claim 28, comprising:
performing an open-failure test of the switches of a stage of the plurality of stages, the performing the open-failure test of the stage of the plurality of stages including:
applying a code of the determined subset of codes to the DAC to:
close all of the switches of other stages of the plurality of stages; and
open all of the switches of the stage of the plurality of stages;
detecting a failure of a switch of the switches of the stage to open in response to the applied code; and
generating an indication of a failure of the open-failure test in response to detecting a failure of a switch of the stage to open in response to the applied code.

30. The method of claim 28, comprising:
performing a closed-failure test of the switches of a stage of the plurality of stages, the closed-failure test of the stage of the plurality of stages including, sequentially for one or more switches of the stage:
applying a code of the determined subset of codes to the DAC to:
close all of the switches of other stages of the plurality of stages;
close a switch of the stage; and
open the other switches of the stage;
detecting a failure of the switch of the stage to close in response to the applied code; and
generating an indication of a failure of the closed-failure test in response to detecting a failure of the switch of the stage to close in response to the applied code.

31. The method of claim 24, comprising:
determining the determined subset of codes.

32. A non-transitory computer-readable medium having contents which cause built-in-self-test (BIST) circuitry of a digital-to-analog converter (DAC) to perform a method, the method comprising:
sequentially applying to codes of a determined subset of codes of a set of inputs codes of the DAC to an input of the DAC, the determined subset of codes having fewer codes than the set of input codes of the DAC;
detecting failures of switches of a plurality of switches of a switching network of the DAC based on responses of the DAC to the applied codes of the determined subset of codes; and
in response to detecting a failure of a switch of the plurality of switches, generating an indication of a failure of the switching network of the DAC, wherein the method includes:
performing an open-failure test of the plurality of switches;
generating an indication of a failure of the open-failure test based on a result of the open-failure test;
selectively performing a closed-failure test of the plurality of switches based on the result of the open-failure test; and
generating an indication of a failure of the closed-failure test based on a result of the closed-failure test.

33. The non-transitory computer-readable medium of claim 32, wherein the method comprises:
controlling the sequential applying of codes of the determined subset of codes based on responses of the DAC to applied codes.

34. The non-transitory computer-readable medium of claim 32, wherein the detecting failures comprises:
comparing a threshold value with an analog response of the DAC to an applied code, generating a logic signal; and
detecting a failure of a switch of the plurality of switches in response to a value of the logic signal being different from an expected value of the logic signal corresponding to the applied code.

35. The non-transitory computer-readable medium of claim 32, wherein the contents comprise instructions executed by the BIST.

* * * * *

UNITED STATES PATENT AND TRADEMARK OFFICE
CERTIFICATE OF CORRECTION

PATENT NO. : 12,105,143 B2
APPLICATION NO. : 17/967089
DATED : October 1, 2024
INVENTOR(S) : Leonardo Pedone et al.

Page 1 of 1

It is certified that error appears in the above-identified patent and that said Letters Patent is hereby corrected as shown below:

In the Claims

<u>Column 27, Claim 1, Line 15:</u>
"mode of operation;" should read: --mode of operation:--.

Signed and Sealed this
Twentieth Day of May, 2025

Coke Morgan Stewart
*Acting Director of the United States Patent and Trademark Office*